(12) United States Patent
Lee et al.

(10) Patent No.: US 10,673,562 B2
(45) Date of Patent: Jun. 2, 2020

(54) SIGNAL RECEIVING CIRCUIT AND OPERATION METHOD THEREOF

(71) Applicant: Samsung Electronics Co., Ltd., Suwon-si, Gyeonggi-do (KR)

(72) Inventors: June-Hee Lee, Seongnam-si (KR); Donghyuk Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/257,249

(22) Filed: Jan. 25, 2019

(65) Prior Publication Data
US 2019/0386775 A1 Dec. 19, 2019

(30) Foreign Application Priority Data
Jun. 18, 2018 (KR) .................. 10-2018-0069765

(51) Int. Cl.
| H04L 1/00 | (2006.01) |
| H03M 13/00 | (2006.01) |
| H03M 13/41 | (2006.01) |
| H04L 25/03 | (2006.01) |

(52) U.S. Cl.
CPC .......... *H04L 1/0054* (2013.01); *H03M 13/41* (2013.01); *H03M 13/6331* (2013.01); *H04L 25/03267* (2013.01)

(58) Field of Classification Search
CPC ............ H04L 1/0054; H04L 25/03267; H03M 13/6331; H03M 13/41
See application file for complete search history.

(56) References Cited

U.S. PATENT DOCUMENTS

| 6,111,923 | A | * | 8/2000 | Mueller | ............ | H04L 25/03197 375/262 |
| 6,266,795 | B1 | | 7/2001 | Wei | | |
| 6,600,794 | B1 | * | 7/2003 | Agarossi | .......... | G11B 20/10009 375/229 |
| 6,647,070 | B1 | * | 11/2003 | Shalvi | ............... | H04L 25/03178 375/263 |
| 6,707,850 | B1 | | 3/2004 | Blake et al. | | |
| 6,829,297 | B2 | | 12/2004 | Xia et al. | | |
| 7,443,936 | B1 | | 10/2008 | Sallaway et al. | | |
| 7,487,432 | B2 | | 2/2009 | Ashley et al. | | |
| 7,688,902 | B1 | * | 3/2010 | Lou | ........................ | H04L 1/0054 375/260 |
| 7,697,642 | B2 | | 4/2010 | Kim | | |
| 8,509,358 | B2 | | 8/2013 | Krakowski | | |
| 2003/0115061 | A1 | * | 6/2003 | Chen | ................. | H04L 25/03184 704/240 |
| 2006/0026494 | A1 | * | 2/2006 | Varma | ............... | H03M 13/4138 714/795 |

(Continued)

*Primary Examiner* — Jean B Corrielus
(74) *Attorney, Agent, or Firm* — Harness, Dickey & Pierce, P.L.C.

(57) ABSTRACT

A signal receiving circuit may include a receiving equalizer and a sequence estimator. The receiving equalizer may be configured to compensate an inter-symbol interference in a signal from an external to output an equalization data, based on a receiving signal from an outside. The sequence estimator may be configured to determine a termination symbol, based on the equalization data, to perform a decoding on the receiving signal, based on the determined termination symbol, and to output the decoded receiving signal as a sequence data.

20 Claims, 16 Drawing Sheets

(56) References Cited

U.S. PATENT DOCUMENTS

| | | | |
|---|---|---|---|
| 2011/0211842 A1* | 9/2011 | Agazzi | H04B 10/6971 |
| | | | 398/141 |
| 2015/0156041 A1 | 6/2015 | Eliaz | |
| 2015/0358184 A1* | 12/2015 | Khayrallah | H04L 25/03961 |
| | | | 375/233 |

* cited by examiner

SIGNAL RECEIVING CIRCUIT AND OPERATION METHOD THEREOF

CROSS-REFERENCE TO RELATED APPLICATIONS

This U.S. non-provisional patent application claims the benefit of priority under 35 U.S.C. § 119 to Korean Patent Application No. 10-2018-0069765, filed on Jun. 18, 2018, in the Korean Intellectual Property Office (KIPO), the entire contents of which are hereby incorporated by reference.

BACKGROUND

Various example embodiments of the inventive concepts relate to an electronic device, and in particular, to a signal receiving circuit, a system including the signal receiving circuit, and/or a method of operating the same.

Electronic devices are configured to transmit/receive (e.g., transceive) electrical signals to/from another electric device through a channel (e.g., a signal line) to exchange information with another electronic device. Owing to response characteristics of the channel, signals to be exchanged between the electronic devices may be distorted. Various types of equalizers are being used to cancel or compensate such signal distortion.

For example, in order to cancel the signal distortion, a decision feedback equalizer (DFE) is used as a part of a receiver of an electronic device. However, with recent increasing demand for an electronic device with high communication speed, a noise may be produced by various causes, other than the signal distortion caused by response characteristics of the channel, and thus, the decision feedback equalizer may be abnormally operated and/or operate abnormally. Furthermore, an error, which is caused by the abnormal operation of the decision feedback equalizer, may affect data to be received in a subsequent operation, and in this case, errors may successively occur.

SUMMARY

Some example embodiments of the inventive concepts provide a highly-reliable signal receiving circuit, a system including a highly-reliable signal receiving circuit, and/or a method of operating the same.

According to some example embodiments of the inventive concepts, a signal receiving circuit may include a receiving equalizer and a maximum likelihood sequence estimator (MLSE). The receiving equalizer may be configured to receive a receiving signal from an external device, generate a compensated received signal by compensating for inter-symbol interference (ISI) included in the received signal, and output equalization data, the equalization data based on the compensated received signal. The MLSE may be configured to determine a termination symbol based on the equalization data, perform Viterbi decoding on the received signal based on the determined termination symbol, and output sequence data, the sequence data based on the Viterbi decoded received signal.

According to some example embodiments of the inventive concepts, a method of operating a signal receiving circuit may include receiving, using at least one processor, a signal from an external device, generating, using the at least one processor, a compensated signal by compensating for inter-symbol interference included in the received signal, generating, using the at least one processor, equalization data based on the compensated signal, determining, using the at least one processor, a termination symbol based on the equalization data, performing, using the at least one processor, a Viterbi decoding on the received signal based on the termination symbol, and output, using the at least one processor, sequence data, the sequence data based on the Viterbi decoded received signal.

According to some example embodiments of the inventive concepts, a signal receiving circuit may include a receiving equalizer, a maximum likelihood sequence estimator (MLSE), and a selector. The receiving equalizer may be configured to receive a signal from an external transmitting device through a communication channel, compensate for an inter-symbol interference (ISI) included in the received signal, and output equalization data, the equalization data based on the compensated received signal. The MLSE may be configured to determine a termination symbol based on at least one of the equalization data, perform Viterbi decoding on the received signal based on the determined termination symbol, and output sequence data, the sequence data based on the Viterbi decoded received signal. The selector may be configured to select and output one of the equalization data and the sequence data based on a state of the communication channel.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which example embodiments are shown.

Figure 1:
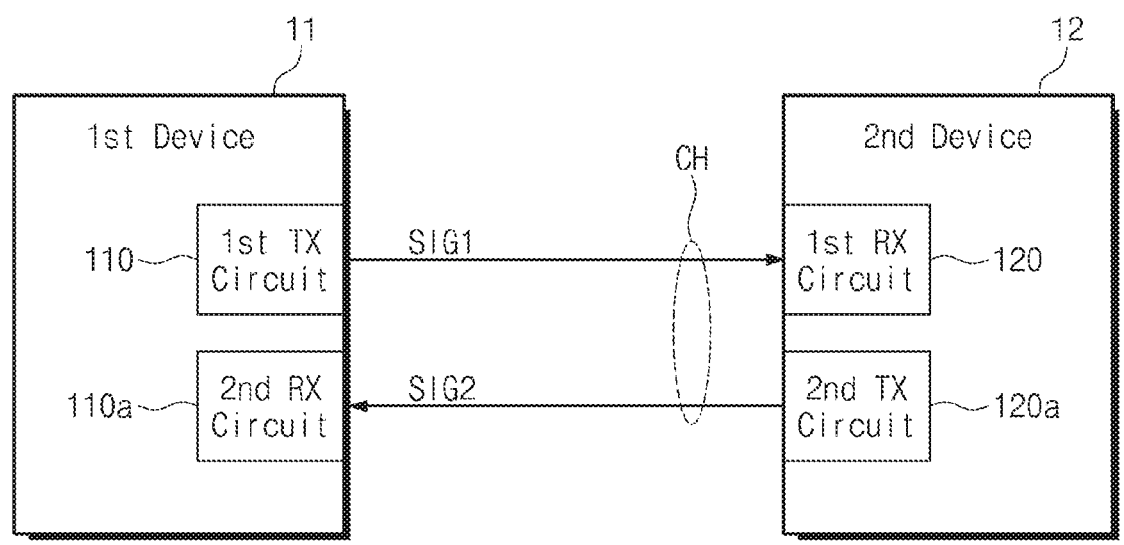
FIG. 1 is a block diagram illustrating an example of an electronic system according to at least one example embodiment of the inventive concepts.

FIG. 1 is a block diagram illustrating an example of an electronic system according to at least one example embodiment of the inventive concepts. Referring to FIG. 1, an electronic system 10 may include a first device 11 and a second device 12, but the example embodiments are not limited thereto. In at least one example embodiment, each of the first and second devices 11 and 12 may be a portable communication terminal, a personal digital assistant (PDA), a portable media player (PMP), a smart phone, a wearable device, a virtual reality (VR) device and/or an augmented reality (AR) device, and/or a computing device (e.g., a personal computer, a server, a workstation, and/or a notebook, etc.). In at least one example embodiment, each of the first and second devices 11 and 12 may be one of various hardware components (e.g., a processor, a memory device, a storage device, or a controller device, etc.) included in a single user device.

The first and second devices 11 and 12 may exchange one or more signals, e.g., SIG1 and SIG2, with each other via at least one communication channel CH. For example, the first device 11 may include a first signal transmitting circuit 110 (hereinafter, "first transmitting circuit"), but is not limited thereto. The first transmitting circuit 110 may be configured to transmit a first signal SIG1, which contains information generated in the first device 11, to the second device 12 through the channel CH. The second device 12 may include a first signal receiving circuit 120 (hereinafter, "first receiving circuit"), but is not limited thereto. The first receiving circuit 120 may be configured to receive the first signal SIG1 transmitted from the first transmitting circuit 110 through the channel CH.

In at least one example embodiment, the second device 12 may include a second transmitting circuit 120a, and the first device 11 may include a second receiving circuit 110a, etc. Similar to the afore-described structure, the second transmitting circuit 120a may be configured to transmit a second signal SIG2 to the first device 11 through the channel CH, and the second receiving circuit 110a may be configured to receive the second signal SIG2 through the at least one channel CH.

In at least one example embodiment, the channel CH may be a wireless communication channel, or one or more signal lines (i.e., wired communication channel) which is used to electrically connect the first device 11 and the second device 12 (and/or other electronic devices) to each other. That is, each of the transmitting and receiving circuits 110, 110a, 120, and 120a may be used to transmit and receive various types of signals, such as electrical, optical, and wireless signals. Hereinafter, for convenience in description, it will be assumed that each of the transmitting and receiving circuits 110, 110a, 120, and 120a is operated based on electrical signals, but the example embodiments are not limited thereto.

In at least one example embodiment, the first transmitting circuit 110 and the second receiving circuit 110a of the first device 11 are separately illustrated and the first receiving circuit 120 and the second transmitting circuit 120a of the second device 12 are separately illustrated, but each pair of them may be implemented as a single transceiver circuit in each of the first and second devices 11 and 12.

In at least one example embodiment, when the first signal SIG1 passes through the channel CH, the first signal SIG1 may be distorted by a noise due to an external factor (e.g., environmental factors, other electronic devices, other electrical components, etc.) and/or a response characteristic of the channel CH. In this case, there may be a difference between information transmitted from the first transmitting circuit 110 and information received by the first receiving circuit 120. That is, information, which is intended to be transmitted from the first device 11, may differ from information received by the second device 12, and this may lead to an error in and/or an abnormal operation of the second device 12.

To decrease and/or prevent the afore-described error and/or abnormal operation, the first transmitting circuit 110 or the first receiving circuit 120 may include elements for compensating for signal distortion, which is caused by a noise due to an external factor and/or a response characteristic. In at least one example embodiment, the first transmitting circuit 110 may include a transmitting equalizer, which is configured to compensate signal distortion caused by response characteristics of the channel CH and/or to compensate for signal distortion in advance, and the first receiving circuit 120 may include a receiving equalizer, which is configured to compensate signal distortion caused by response characteristics of the channel CH, and a sequence estimator, which is configured to estimate data (e.g., a symbol or a sequence), based on the received signal.

The structures and operations of the first transmitting circuit 110 and the first receiving circuit 120 will be described in more detail with reference to the accompanying drawings. Hereinafter, for convenience in description, some example embodiments of the inventive concepts will be described on the basis of the first transmitting circuit 110 of the first device 11 and the first receiving circuit 120 of the second device 12. However, the example embodiments of the inventive concepts are not limited to this example.

Figure 2:
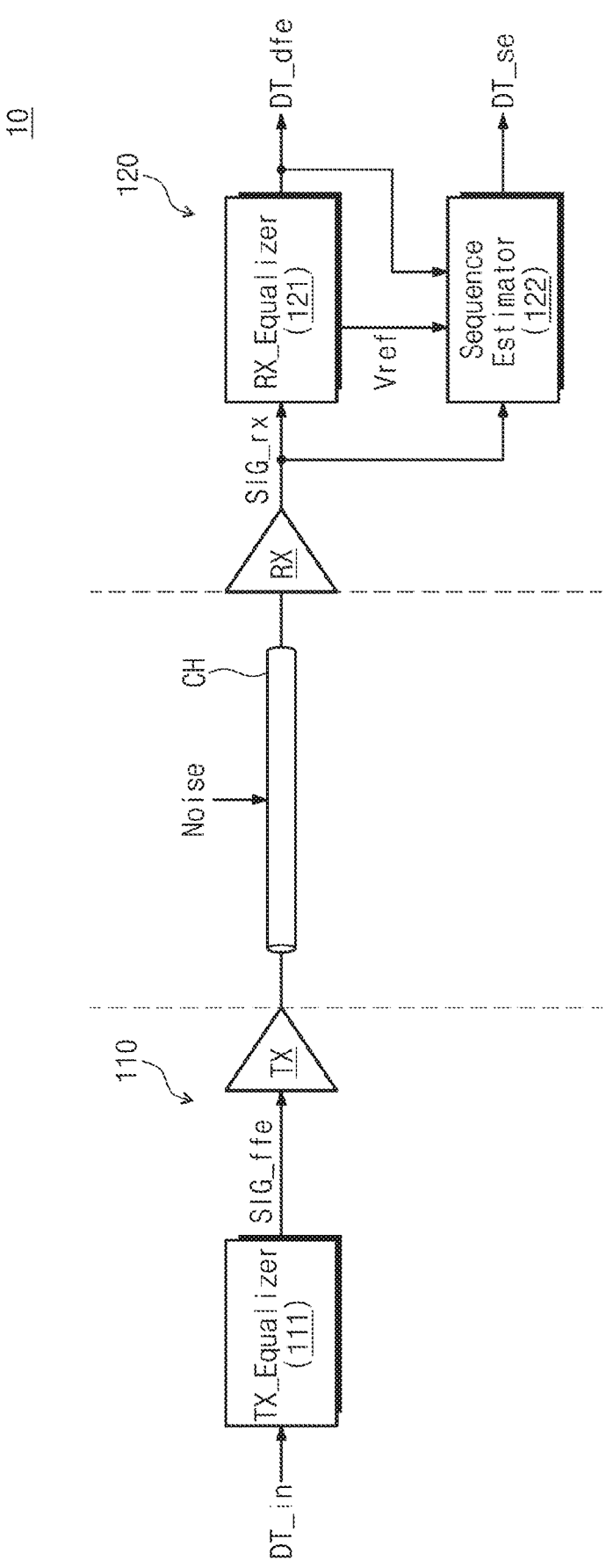
FIG. 2 is a block diagram illustrating a first transmitting circuit and a first receiving circuit of FIG. 1 according to at least one example embodiment.

FIG. 2 is a block diagram illustrating a first transmitting circuit and a first receiving circuit of FIG. 1 according to at least one example embodiment. For convenience in the drawings, some elements of the first transmitting circuit and the first receiving circuit are omitted. Hereinafter, for convenience in description, terms of "signal", "data", "symbol", and "bit" will be used to refer to signals generated by, transmitted from, or received by elements. Such terms are used for the purpose for providing simplified description of the inventive concepts, and the technical meaning of each of the terms should be understood in light of functional relationship between each element and other elements.

In addition, to provide better understanding of the inventive concepts, it will be assumed that a transmitting equalizer 111 is a feed-forward equalizer (FFE) and a receiving equalizer 121 is a decision feedback equalizer (DFE). However, the example embodiments of the inventive concepts are not limited to this example, and the transmitting equalizer 111 and the receiving equalizer 121 may be implemented as one of various signal compensation circuits.

Referring to FIGS. 1 and 2, the first transmitting circuit 110 may include the transmitting equalizer 111 and/or a transmitting driver TX, etc., according to at least one example embodiment, but the example embodiments are not limited thereto. The transmitting equalizer 111 may be configured to receive an input data DT_in and to output an output signal SIG_ffe (hereinafter, called "FFE signal") based on the received input data DT_in. For example, the transmitting equalizer 111 may be a feed-forward equalizer (FFE), but is not limited thereto. To cancel an inter-symbol interference (ISI) between the input data DT_in caused by response characteristics of the channel CH, the transmitting equalizer 111 may generate the FFE signal SIG_ffe by reflecting desired and/or predetermined coefficients into a preceding symbol, a current symbol, and a following symbol of the input data DT_in. In at least one example embodiment, the symbol may mean one or more bits data having a specific logical value.

As a more detailed example, in the case where first to third symbols are successively transmitted through the channel CH, due to response characteristics of the channel CH, a signal corresponding to the first symbol may affect the second and third symbols, a signal corresponding to the second symbol may affect the first and third symbols, and a signal corresponding to the third symbol may affect the first and second symbols. In the transmitting equalizer 111, the FFE signal SIG_ffe may be generated by compensating the influence (i.e., ISI) of each of the first to third symbols on other symbols.

The transmitting driver TX may transmit the FFE signal SIG_ffe to the first receiving circuit 120 of the second device 12 through the channel CH.

The first receiving circuit 120 may include a receiving driver RX, the receiving equalizer 121, and/or a sequence estimator 122, but is not limited thereto. The receiving driver RX may receive the FFE signal SIG_ffe, which is transmitted from the first transmitting circuit 110 through the channel CH, and may output the signal as a receiving signal SIG_rx. In at least one example embodiment, since the FFE signal SIG_ffe passes through the channel CH, the FFE signal SIG_ffe may be distorted by a noise and/or due to response characteristics of the channel CH. That is, the receiving driver RX may receive the FFE signal SIG_ffe, which is distorted, for example, by the channel CH and the noise, and may output it as the receiving signal SIG_rx. In this case, the receiving signal SIG_rx may be a signal, in which components given by the FFE signal SIG_ffe and distortion components caused by the response characteristics of the channel CH and the noise are included.

In at least one example embodiment, when the transmitting equalizer 111 is ideally operated, the inter-symbol interference ISI may be normally cancelled and/or compensated and there is no a noise factor in the channel CH. In such a case, even when the receiving equalizer 121 and the sequence estimator 122 are absent, it may be possible to normally determine the initially input data DT_in based on the receiving signal SIG_rx. However, owing to various external factors, it is difficult to realize the ideal operation of the transmitting equalizer 111 and to prevent the noise from entering the channel CH, and thus, it may be difficult to normally determine the initially input data DT_in based on the receiving signal SIG_rx.

The receiving equalizer 121 may be configured to output an equalization data DT_dfe (hereinafter, called "DFE data"), based on the receiving signal SIG_rx. For example, the receiving equalizer 121 may be a decision feedback equalizer (DFE). The receiving equalizer 121 may reflect desired and/or predetermined coefficients into a preceding symbol, a current symbol, and a following symbol, respectively, to remove the inter-symbol interference from the receiving signal SIG_rx and thereby output the DFE data DT_dfe. In at least one example embodiment, an operation principle of the receiving equalizer 121 may be similar to an operation principle of the transmitting equalizer 111.

In at least one example embodiment, the receiving equalizer 121 may output the DFE data DT_dfe, from which the inter-symbol interference is removed. However, in the case where a noise resulting from an external factor is included in the receiving signal SIG_rx, the receiving equalizer 121 may have difficulty in compensating for signal distortion caused by the noise. In this case, the DFE data DT_dfe may be a value different from that of the initially input data DT_in. Furthermore, in the case where the receiving equalizer 121 produces an error at a specific data and/or at a specific symbol, the error, which is produced by the operation of the receiving equalizer 121, may affect the following data, and thereby errors may successively occur (and/or continuously occur, the errors may be compounded, etc.).

The first receiving circuit 120 according to some example embodiments of the inventive concepts may include the sequence estimator 122 for improving reliability of signal, data, symbol, and so forth. The sequence estimator 122 may determine a sequence data DT_se having the maximum likelihood (or, probability), based on the receiving signal SIG_rx. The sequence data DT_se may mean a bit column and/or a data column including the specific number of bits.

In at least one example embodiment, the sequence estimator 122 may be the Viterbi-algorithm-based maximum likelihood sequence estimator (MLSE). For example, the sequence estimator 122 may be configured to execute a Viterbi algorithm and/or a Viterbi decoding, based on the receiving signal SIG_rx. Here, the sequence estimator 122 may determine a termination symbol (or a start symbol), based on the DFE data DT_dfe from the receiving equalizer 121. In other words, the sequence data DT_se may mean a bit column and/or a data column produced as a result of the execution of the Viterbi decoding on a receiving signal DT_rx.

As a more detailed example, in the case where one sequence data DT_se is a unit of data to be processed by the decoding operation of the sequence estimator 122 and each sequence data DT_se includes 8 symbols, the sequence estimator 122 may be configured to execute the decoding operation on the eight successive symbols included in the receiving signal SIG_rx. Here, the sequence estimator 122 may use a value corresponding to the last symbol of the preceding sequence data DT_se of the DFE data DT_dfe as a termination symbol of the receiving signal SIG_rx to be currently decoded.

In other words, since the sequence estimator 122 determines the termination symbol in the current decoding operation based on a value of the DFE data DT_dfe (e.g., the output of the receiving equalizer 121), it may be possible to improve the operational reliability of the sequence estimator 122 and to reduce the burden of calculation. For example, in the case where there is no termination symbol, a termination symbol is arbitrarily selected and/or an initial decoding is performed to execute a calculation for each of several states of a single symbol. However, in the case where the termination symbol is arbitrarily selected, it is difficult to guarantee the reliability of the termination symbol, and in the case where the calculation is executed for each of the states, the burden of calculation may be increased.

Since the DFE data DT_dfe of the receiving equalizer 121 is ISI-free data, the DFE data DT_dfe may be regarded to be reliable compared with the arbitrarily selected termination symbol. Thus, since the sequence estimator 122 determines a termination symbol for the decoding operation based on the DFE data DT_dfe, it may be possible to improve the reliability of decoding result and to reduce the burden of calculation.

In at least one example embodiment, the sequence estimator 122 may determine a reference set (e.g., a reference set of voltages) based on a reference voltage Vref of the receiving equalizer 121. For example, the receiving equalizer 121 may determine the DFE data DT_dfe from the receiving signal SIG_rx, based on the reference voltage Vref. In other words, the reference voltage Vref may be a voltage and/or signal level, which is used to determine the DFE data DT_dfe from the receiving signal SIG_rx in the receiving equalizer 121. In at least one example embodiment, the reference voltage Vref may be associated with a main coefficient to be used in the receiving equalizer 121. In at least one example embodiment, the reference voltage Vref may be associated with an IS I-free and/or noise-free signal level for a specific state of a symbol. The main coefficient may indicate a coefficient that is reflected in a current symbol in the receiving equalizer 121. An operation of the sequence estimator 122 for determining a reference set based on the reference voltage Vref of the receiving equalizer 121 will be described in more detail with reference to FIG. 6.

As described above, the first receiving circuit 120 according to some example embodiments of the inventive concepts may determine a termination symbol, which will be used in the decoding operation, based on the equalization data (i.e., the DFE data DT_dfe) from the receiving equalizer 121, and may determine a reference set, which will be used in the decoding operation, based on the reference voltage Vref of the receiving equalizer 121. Thus, even when a noise is produced by various external factors, the sequence estimator 122 can be used to normally estimate the sequence data DT_se, and this may make it possible to improve the reliability of the first receiving circuit 120.

Figure 3:
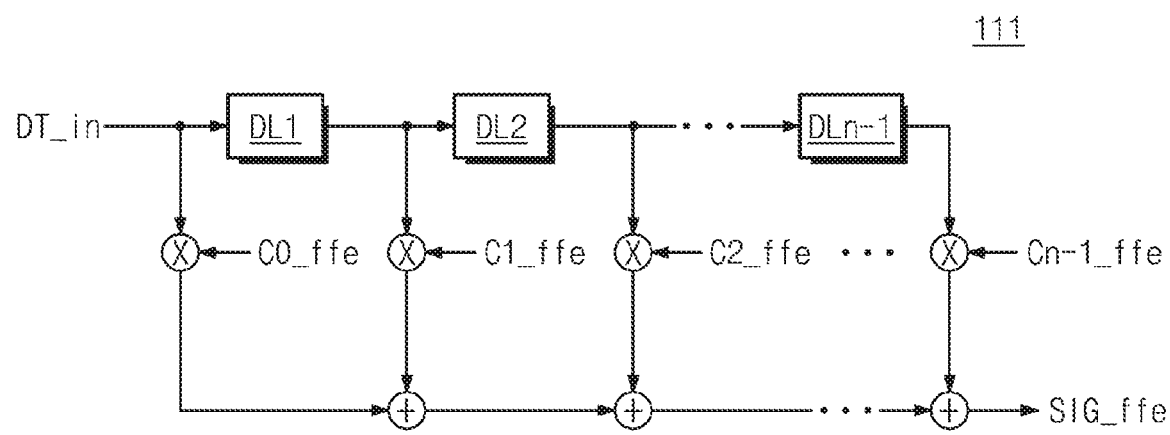
FIG. 3 is a block diagram illustrating an example of a transmitting equalizer of FIG. 2 according to at least one example embodiment.

FIG. 3 is a block diagram illustrating an example of a transmitting equalizer of FIG. 2. The transmitting equalizer 111 of FIG. 3 may be an example of the feed-forward equalizer (FFE), but the example embodiments of the inventive concepts are not limited to this structure of the transmitting equalizer 111.

Referring to FIGS. 2 and 3, the transmitting equalizer 111 may include a plurality of delay units DL1-DLn−1, etc. Each of the delay units DL1-DLn may be configured to retard an input signal by a desired and/or predetermined time interval (e.g., one period or one cycle of input data, etc.). The delay units DL1-DLn−1 may be connected in a cascade structure, but are not limited thereto. For example, a first delay unit DL1 may be configured to delay the input data DT_in by the desired and/or predetermined time interval and to output the delayed data, and a second delay unit DL2 may be configured to delay the output of the first delay unit DL1 by the desired and/or predetermined time interval and to output the delayed data. Each of the remaining delay units may also be configured to delay an output of a preceding delay unit by the desired and/or predetermined time interval and to output the delayed data, or may be configured to delay the output by a different time interval.

In other words, when compared with the input data DT_in, the output of the first delay unit DL1 may be a signal that is delayed by one period, the output of the second delay unit DL2 may be a signal that is delayed by two periods (i.e., two times the period), and the output of the (n−1)-th delay unit DLn−1 may be a signal that is delayed by (n−1) periods (i.e., (n−1) times the period), etc.

A plurality of FFE coefficients C0_ffe-Cn−1_ffe may be reflected into outputs of the delay units DL1-DLn−1, respectively. For example, a zeroth FFE coefficient C0_ffe may be reflected into the input data DT_in, a first FFE coefficient C1_ffe may be reflected into the output of the first delay unit DL1, a second FFE coefficient C2_ffe may be reflected into the output of the second delay unit DL2, and an (n−1)-th FFE coefficient Cn−1_ffe may be reflected into the output of the (n−1)-th delay unit DLn−1. In at least one example embodiment, the FFE coefficients C0_ffe to Cn−1_ffe may be coefficients for in-advance compensating signal distortion caused by response characteristics of the channel CH (e.g., prospective signal distortion compensation, etc.) and may be determined in advance through an additional training operation.

All of the signals, into which the FFE coefficients C0_ffe-Cn−1_ffe are reflected, may be summed, and the summed signals may be output as the FFE signal SIG_ffe.

In at least one example embodiment, the transmitting equalizer 111 of FIG. 3 may be an equalizer of an N-tap structure, and the number of the delay units DL1-DLn−1 may vary depending on the number of taps in the transmitting equalizer 111, but the example embodiments are not limited thereto.

Figure 4A:
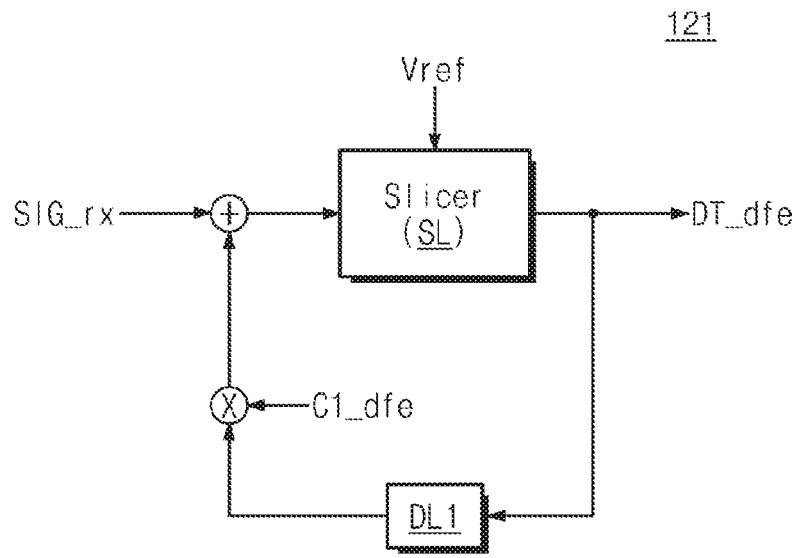
FIGS. 4A and 4B are block diagrams illustrating examples of a receiving equalizer of FIG. 2 according to at least one example embodiment.
Figure 4B:
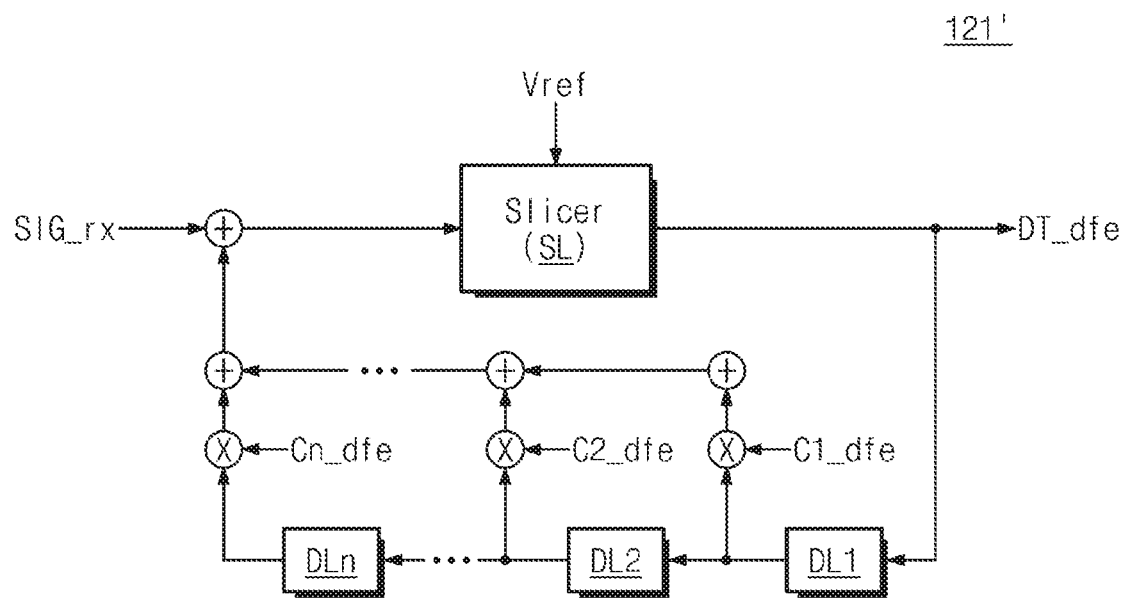

FIGS. 4A and 4B are block diagrams illustrating examples of a receiving equalizer of FIG. 2 according to at least one example embodiment. The receiving equalizers 121 and 121' of FIGS. 4A and 4B are examples of the decision feedback equalizer (DFE), but the receiving equalizer according to some example embodiments of the inventive concepts are not limited to this example.

Referring to FIGS. 2 and 4A, the receiving equalizer 121 may include a slicer SL and/or the first delay unit DL1, but is not limited thereto. The slicer SL may output the DFE data DT_dfe from the receiving signal SIG_rx, based on the reference voltage Vref. For example, the slicer SL may compare the receiving signal SIG_rx with the reference voltage Vref to sample the DFE data DT_dfe and then may output the sampled DFE data DT_dfe.

The first delay unit DL1 may be used to delay the DFE data DT_dfe by a desired and/or predetermined time interval. The desired and/or predetermined time interval may correspond to one period of the DFE data DT_dfe. In other words, when compared with the DFE data DT_dfe, the output of the first delay unit DL1 may be a signal, which is delayed by one period.

A first DFE coefficient C1_dfe may be reflected in the output from the first delay unit DL1. The signal, into which the first DFE coefficient C1_dfe is reflected, may be summed with the receiving signal SIG_rx and then may be provided to the slicer SL. The signal, into which the first DFE coefficient C1_dfe is reflected, may be used to compensate the inter-symbol interference, and thus, the signal provided to the slicer SL may be an ISI-free signal.

In at least one example embodiment, the receiving equalizer 121 of FIG. 4A may be an equalizer having a one-tap structure, but is not limited thereto. In other words, the receiving equalizer 121 of FIG. 4A may be used to cancel the inter-symbol interference for the signal before one period has elapsed. However, the example embodiments of the inventive concepts are not limited to this example, and the receiving equalizer may be configured to have an n-tap structure. For example, as shown in FIG. 4B, the receiving equalizer 121' may include the slicer SL and a plurality of the delay units DL1 to DLn.

The delay units DL1 to DLn may be connected to have a cascade structure and may be configured to output a signal, which is delayed by a desired and/or predetermined time interval (e.g., the one period of the DFE data DT_dfe), compared with a signal input thereto. For example, the first delay unit DL1 may be configured to output the DFE data DT_dfe delayed by one period, and the second delay unit DL2 may be configured to output the output of the first delay unit DL1 delayed by one period. Similarly, the n-th delay unit DLn may be configured to output an output of a preceding delay unit delayed by one period (and/or by a desired time interval).

A plurality of DFE coefficients C1_dfe to Cn_dfe may be respectively reflected into (e.g., inserted into, added to, etc.) the outputs from the delay units DL1 to DLn. For example, the first DFE coefficient C1_dfe may be reflected into the output from the first delay unit DL1, a second DFE coefficient C2_dfe may be reflected into the output of the second delay unit DL2, etc. Similarly, an n-th DFE coefficient Cn_dfe may be reflected into the output of the n-th delay unit DLn. Each of the DFE coefficients C1_dfe-Cn_dfe may be a value (e.g., a desired value) for compensating for the inter-symbol interference. Each of the DFE coefficients C1_dfe to Cn_dfe may be determined in advance through an additional training operation, but the example embodiments are not limited thereto and the DFE coefficients may be determined during real-time operation. The signals, into which the DFE coefficients C1_dfe-Cn_dfe are reflected, may be summed and then the summed signal may be provided to the slicer SL.

The receiving equalizer 121 may compensate for the inter-symbol interference, which is caused by response characteristics of the channel CH, through a feedback path. In at least one example embodiment, although the receiving equalizer 121 is used to compensate for the inter-symbol interference, which is caused by response characteristics of the channel CH, through the feedback path, the use of the receiving equalizer 121 may not guarantee that a noise, which is included in the channel CH by various factors, is compensated (e.g., the use of the receiving equalizer 121 may not fully compensate for and/or correct the errors in the signal transmitted through the channel CH). In this case, an error may be included in the DFE data DT_dfe.

As described with reference to FIG. 2, the first receiving circuit 120 may include the sequence estimator 122, and the sequence estimator 122 may be configured to decode the receiving signal SIG_rx and to estimate and/or extract the sequence data DT_se, regardless of a noise in the channel CH. In at least one example embodiment, reliability of the sequence data DT_se may be higher than that of the DFE data DT_dfe. Hereinafter, the structure and operation of the sequence estimator 122 will be described in more detail with reference to the accompanying drawings.

Figure 5:
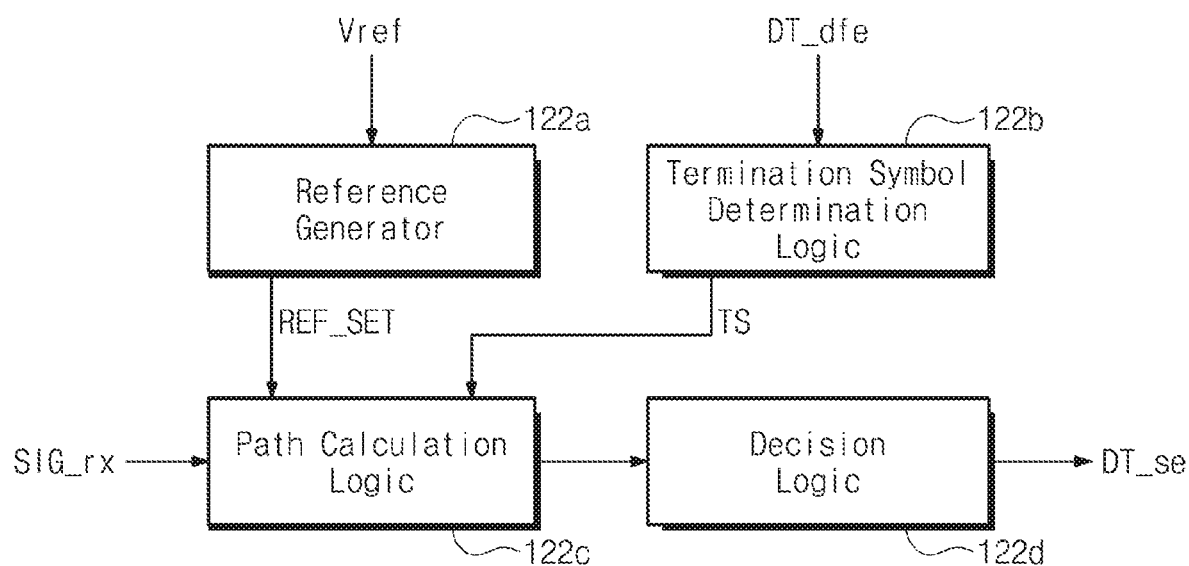
FIG. 5 is a block diagram illustrating a sequence estimator of FIG. 2 according to at least one example embodiment.

FIG. 5 is a block diagram illustrating the sequence estimator 122 of FIG. 2. Referring to FIG. 5, the sequence estimator 122 may include a reference generator 122a, a termination symbol determination logic 122b, a path calculation logic 122c, and a decision logic 122d. In at least one example embodiment, each of the elements shown in FIG. 5 may be provided in the form of hardware circuitry specially hardwired, or a combination of software and hardware, such as special purpose SoC, FPGA, processor, and/or other processing device, specially programmed to perform the operations of at least one example embodiment. Hereinafter, in order to provide better understanding of the inventive concepts, it is assumed that one symbol consists of two bits. In other words, each symbol may be assumed to have four different states. However, the example embodiments of the inventive concepts are not limited to this example, and each symbol may include one or more bits and may have a lesser or greater number of states.

The reference generator 122a may be configured to generate a reference set REF_SET, based on the reference voltage Vref of the receiving equalizer 121. For example, the reference set REF_SET may be a set of reference levels, which are required to calculate paths between stages in the path calculation logic 122c. The operation of the reference generator 122a and the reference set REF_SET will be described in more detail with reference to FIG. 6.

The termination symbol determination logic 122b may be configured to determine a termination symbol TS, based on the DFE data DT_dfe of the receiving equalizer 121. For example, the termination symbol TS may represent an initial state (or, a starting symbol), which is required to calculate an initial path in the path calculation logic 122c. The termination symbol determination logic 122b may determine the termination symbol TS, based on a value of the DFE data DT_dfe, which corresponds to the last symbol of the preceding sequence data. The operation and the structure of the termination symbol determination logic 122b will be described in more detail with reference to FIG. 7.

The path calculation logic 122c may receive the receiving signal SIG_rx output from the receiving driver RX, may receive the reference set REF_SET from the reference generator 122a, and/or may receive the termination symbol TS from the termination symbol determination logic 122b. The path calculation logic 122c may be configured to perform a path calculation for the receiving signal SIG_rx, based on the termination symbol TS and the reference set REF_SET. A method of operating the path calculation logic 122c will be described in more detail with reference to FIG. 8.

The decision logic 122d may determine the sequence data DT_se, based on the operation result of the path calculation logic 122c. For example, the decision logic 122d may be configured to select a shortest path from possible paths between stages and to determine states on the selected path as states for each symbol. The determined states may represent the sequence data DT_se. A method of operating the decision logic 122d will be described in more detail with reference to FIG. 9.

In at least one example embodiment, the path calculation logic 122c and the decision logic 122d may be configured to serve as the maximum likelihood sequence estimator (MLSE), which is operated based on the Viterbi algorithm, or the Viterbi decoder. That is, although FIG. 5 illustrates the path calculation logic 122c and the decision logic 122d, the example embodiments of the inventive concepts are not limited to this example. For example, the path calculation logic 122c and the decision logic 122d may be replaced with the MLSE or the Viterbi decoder.

Figure 6:
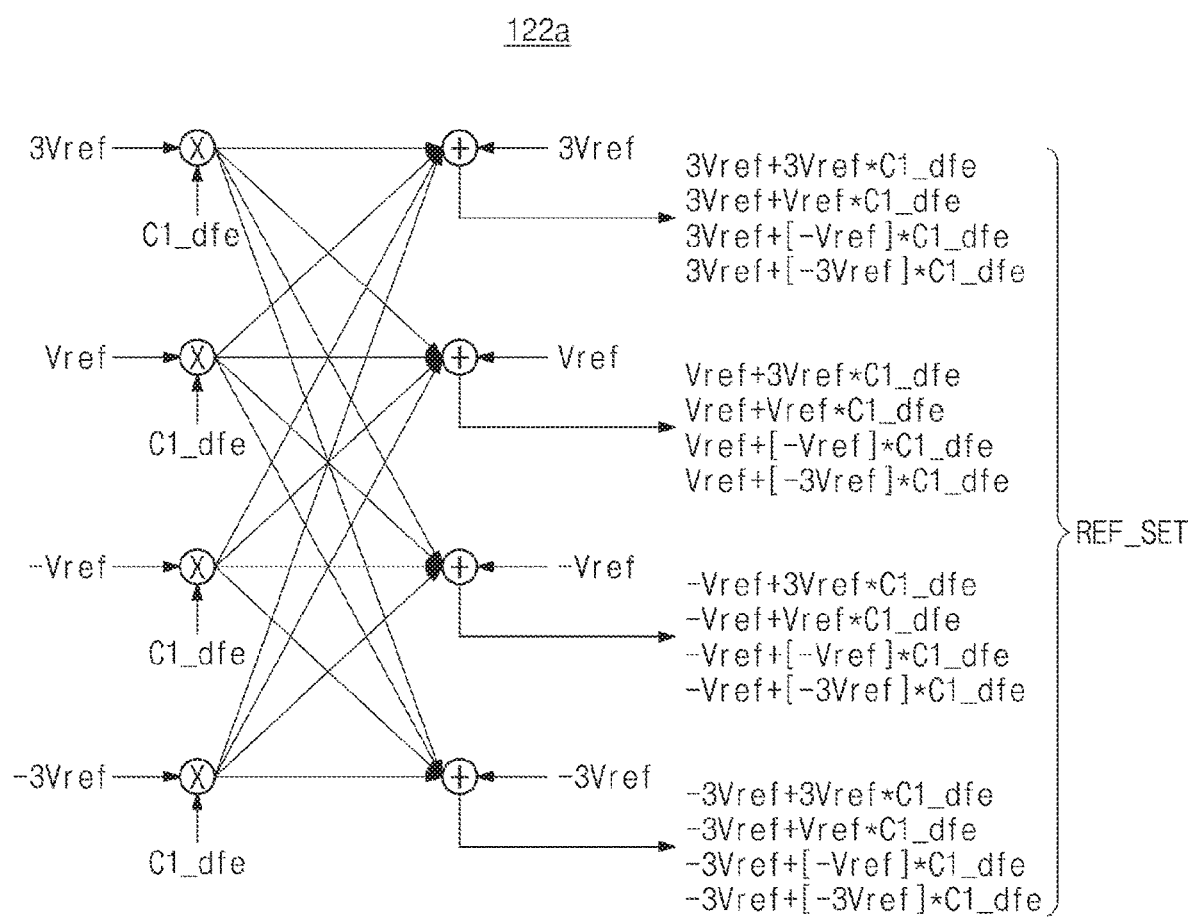
FIG. 6 is a diagram illustrating a reference generator of FIG. 5 according to at least one example embodiment.

FIG. 6 is a diagram for describing a reference generator of FIG. 5. For convenience in description, each symbol is assumed to have four different states (i.e., one symbol is assumed to include two bits of data), but the example embodiments are not limited thereto.

Referring to FIGS. 5 and 6, the reference generator 122a may be configured to generate the reference set REF_SET, based on the reference voltage Vref. For example, the reference voltage Vref may be a reference signal level (e.g., a desired voltage, etc.), which is used to determine the states of the symbols in the receiving equalizer 121. For example, the reference generator 122a may generate reference levels 3Vref, Vref, −Vref, and −3Vref for respective states, based on the reference voltage Vref, but is not limited thereto. Here, the reference levels 3Vref, Vref, −Vref, and −3Vref may be reference levels, which are used to determine the first to fourth states, respectively.

The reference generator 122a may reflect the first DFE coefficient C1_dfe into each of the reference levels, e.g., 3Vref, Vref, −Vref, and −3Vref, and may sum the level, into which the first DFE coefficient C1_dfe is reflected, with the reference levels, 3Vref, Vref, −Vref, and −3Vref. As a result of the above calculation operation, the reference set REF_SET including a plurality of reference levels, e.g., 16 reference levels, may be generated.

In at least one example embodiment, the plurality of reference levels, e.g., 16 reference levels, of the reference set REF_SET may be used as a reference level for calculating a path from a preceding symbol to a current symbol. For example, the reference level "3Vref+3Vref*C1_dfe" may be used as a reference level for calculating a path along which a symbol is moved from the first state (e.g., the state of the preceding symbol is in the first state, etc.) to the first state (e.g., the current symbol is in the first state, etc.), the reference level "3Vref+Vref*C1_dfe" may be used as a reference level for calculating a path along which the symbol is moved from the second state (e.g., the state of the preceding symbol is in the second state, etc.) to the first state (e.g., the current symbol is in the first state, etc.), the reference level "3Vref+[−Vref]*C1_dfe" may be used as a reference level for calculating a path along which the symbol is moved from the third state (e.g., the state of the preceding symbol is in the third state, etc.) to the first state (e.g., the current symbol is in the first state, etc.), and the reference level "3Vref+[−3Vref]*C1_dfe" may be used as a reference level for calculating a path along which the symbol is moved from the fourth state (e.g., the state of the preceding symbol is in the fourth state, etc.) to the first state (e.g., the current symbol is in the first state, etc.). The following table 1 shows an example of the preceding and current states of a symbol for each of the reference levels, but the example embodiments are not limited thereto. In some example embodiments, the reference levels in Table 1 show reference levels on the basis of pulse amplitude modulation-4 (PAM-4), but are not limited thereto.

TABLE 1

| Reference Level | State of Preceding Symbol | State of Current Symbol |
|---|---|---|
| 3Vref + 3Vref*C1_dfe | First state | First state |
| 3Vref + Vref*C1_dfe | Second state | |
| 3Vref + [−Vref]*C1_dfe | Third state | |

TABLE 1-continued

| Reference Level | State of Preceding Symbol | State of Current Symbol |
|---|---|---|
| 3Vref + [−3Vref]*C1_dfe | Fourth state | |
| Vref + 3Vref*C1_dfe | First state | Second state |
| Vref + Vref*C1_dfe | Second state | |
| Vref + [−Vref]*C1_dfe | Third state | |
| Vref + [−3Vref]*C1_dfe | Fourth state | |
| −Vref + 3Vref*C1_dfe | First state | Third state |
| −Vref + Vref*C1_dfe | Second state | |
| −Vref + [−Vref]*C1_dfe | Third state | |
| −Vref + [−3Vref]*C1_dfe | Fourth state | |
| −3Vref + 3Vref*C1_dfe | First state | Fourth state |
| −3Vref + Vref*C1_dfe | Second state | |
| −3Vref + [−Vref]*C1_dfe | Third state | |
| −3Vref + [−3Vref]*C1_dfe | Fourth state | |

As shown in Table 1, each reference level may be used to calculate a path between the states, based on a state of a preceding symbol and a state of a current symbol. In at least one example embodiment, an expression "calculate a path" may be used to represent a process of obtaining information regarding the path (e.g., a length of the path and/or a likelihood of the path). FIG. 6 illustrates the reference generator 122a having the one-tap structure, but the example embodiments of the inventive concepts are not limited to this example. For example, the reference generator 122a may be configured to have an n-tap structure, and in this case, a signal, in which other DFE coefficients are reflected, may be summed with each reference level, etc.

Figure 7:
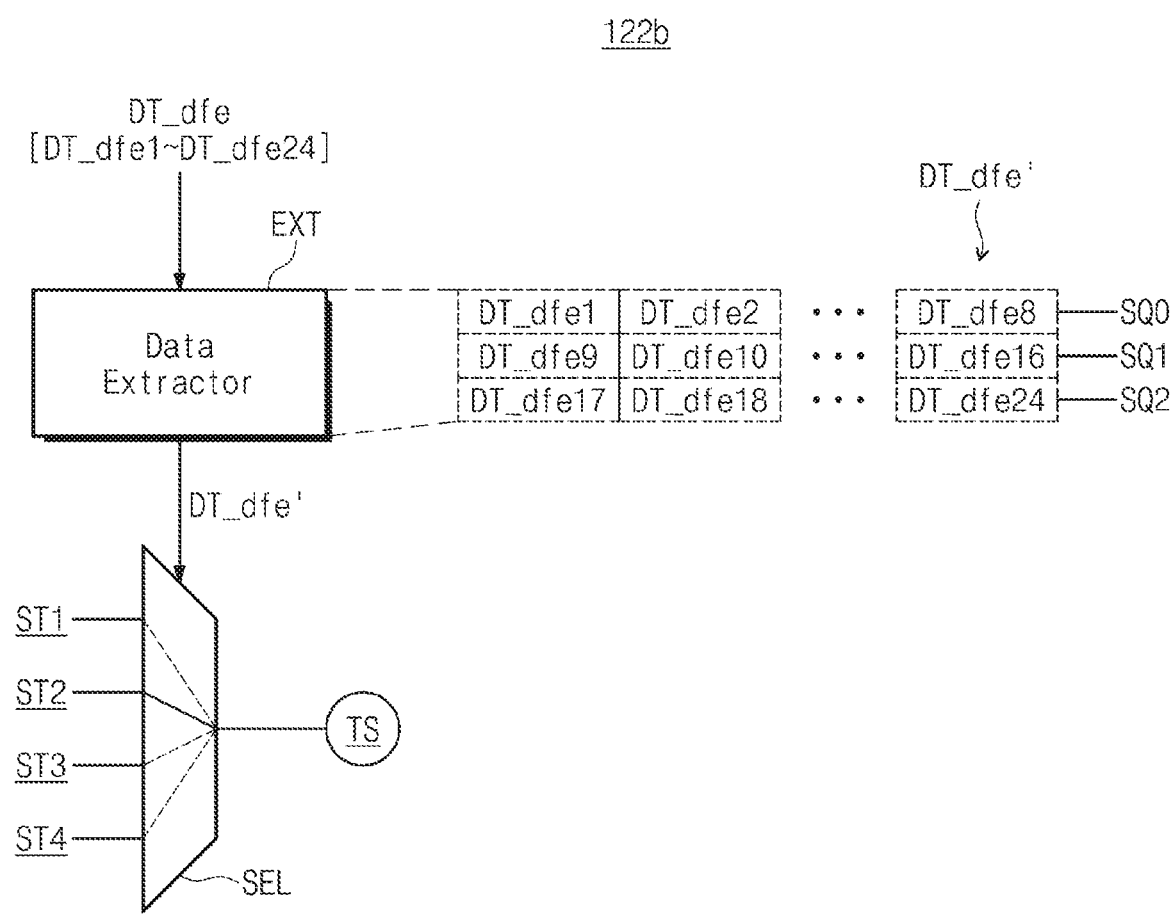
FIG. 7 is a diagram illustrating an example of a termination symbol determination logic of FIG. 5 according to at least one example embodiment.

FIG. 7 is a diagram illustrating an example of a termination symbol determination logic of FIG. 5 according to at least one example embodiment. Referring to FIGS. 5 and 7, the termination symbol determination logic 122b may include a data extractor EXT and a selector SEL, but is not limited thereto.

The data extractor EXT may be configured to extract a value DT_dfe' (hereinafter, "preceding DFE data") of the DFE data DT_dfe, which corresponds to the last data of the preceding sequence data. For example, it is assumed that each DFE data DT_dfe consists of one symbol and each sequence data DT_se consists of eight symbols, but the example embodiments are not limited thereto. In this case, a plurality of DFE data DT_dfe1 to DT_dfe24 received from the receiving equalizer 121 may be grouped into a plurality of groups, e.g., three groups, each of which include DFE data, e.g., eight DFE data, as shown in FIG. 7. For example, first to eighth DFE data DT_dfe1 to DT_dfe8 may correspond to a zeroth sequence data DT_se0, ninth to sixteenth DFE data DT_dfe9 to DT_dfe16 may correspond to a first sequence data DT_se1, and seventeenth to twenty-fourth DFE data DT_dfe17 to DT_dfe24 may correspond to a second sequence data DT_se2.

When the path calculation logic 122c executes a path calculation on the first sequence data DT_se1, the data extractor EXT may extract a DFE data (i.e., eighth DFE data DT_dfe8), which corresponds to the last data of the zeroth sequence data DT_se0 that is a preceding sequence data of the first sequence data DT_se1, as the preceding DFE data DT_dfe'. Similarly, when the path calculation logic 122c executes a path calculation on the second sequence data DT_se2, the data extractor EXT may output the sixteenth DFE data DT_dfe16 as the preceding DFE data DT_dfe'.

In at least one example embodiment, the data extractor EXT may be configured to output the DFE data DT_dfe with a desired and/or predetermined interval. Here, the desired and/or predetermined interval may correspond to a length of one sequence data.

The selector SEL may be configured to select one of a plurality of states, e.g., first to fourth states ST1-ST4, as the termination symbol TS, based on the preceding DFE data DT_dfe'. For example, in the case where the preceding DFE data DT_dfe' is a value corresponding to the second state ST2, the selector SEL may select the second state ST2 as the termination symbol TS. In at least one example embodiment, a reference level (e.g., one of 3Vref, Vref, −Vref, and −3Vref in FIG. 6) corresponding to the selected state may be provided as a level of the termination symbol TS.

Figure 8:
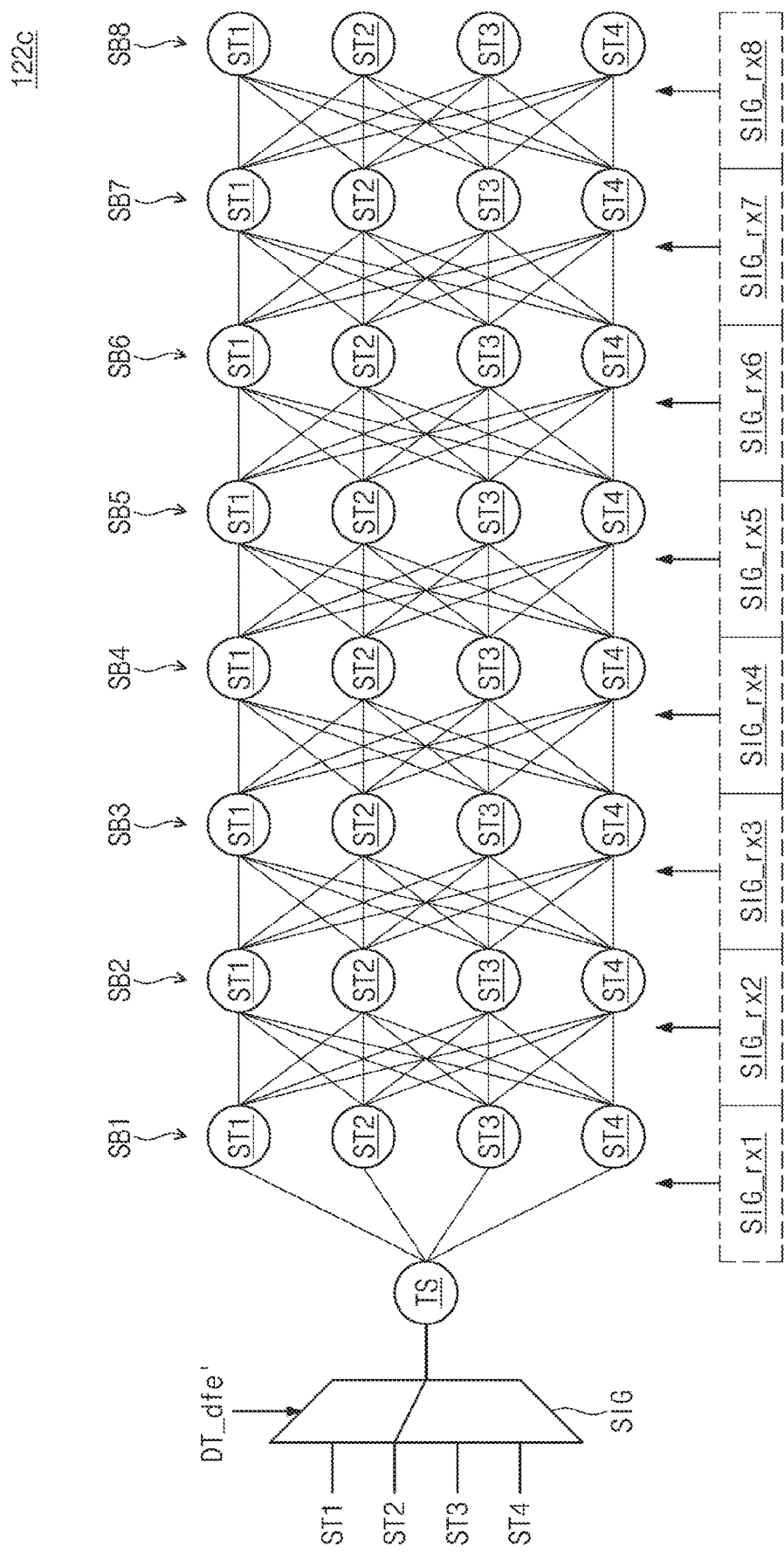
FIG. 8 is a diagram illustrating an operation of a path calculation logic of FIG. 5 according to at least one example embodiment.

FIG. 8 is a diagram illustrating an operation of a path calculation logic of FIG. 5 according to at least one example embodiment. In order to provide better understanding of the example embodiments of the inventive concepts, some elements, which do not relate to the path calculation operation, will be omitted from the following description.

It will be assumed that each symbol consists of four states ST1-ST4 (i.e., 2 bits) and that each sequence data DT_se consists of eight symbols. However, the example embodiments of the inventive concepts are not limited to this example, and the number of states, the bit length of the states, and/or the length of the symbol sequence may vary.

Referring to FIGS. 5 and 8, the termination symbol determination logic 122b may select one of the plurality of states, e.g., first to fourth states ST1-ST4, as the termination symbol TS, based on the preceding DFE data DT_dfe'. As shown in FIG. 8, it is assumed that the second state ST2 is selected as the termination symbol TS. In this case, a DFE data corresponding to the last symbol of a preceding sequence data may be a value corresponding to the second state ST2.

The path calculation logic 122c may receive a plurality of signals, e.g., first to eighth receiving signals SIG_rx1 to SIG_rx8. The first to eighth receiving signals SIG_rx1-SIG_rx8 may be signals provided from the receiver RX (e.g., see FIG. 1), the first to eighth receiving signals SIG_rx1-SIG_rx8 may contain information on a corresponding one of first to eighth symbols SB1-SB8, respectively. In other words, the first receiving signal SIG_rx1 may correspond to the first symbol SB1, and the second receiving signal SIG_rx2 may correspond to the second symbol SB2.

The path calculation logic 122c may be configured to execute a path calculation operation on the symbols, e.g., first to eighth symbols SB1 to SB8, based on the selected termination symbol TS, the first to eighth receiving signals SIG_rx1-SIG_rx8, and the reference set REF_SET (not shown in FIG. 8).

In at least one example embodiment, for the first symbol SB1, the path calculation logic 122c may calculate a path from the termination symbol TS to each of the first to fourth states ST1-ST4 of the first symbol SB1. Since the termination symbol TS is selected from the second state ST2, the reference levels, in which the preceding state is in the second state, (e.g., "3Vref+Vref*C1_dfe", "Vref+Vref*C1_dfe", "−Vref+Vref*C1_dfe", "−3Vref+Vref*C1_dfe") may be used, as shown in Table 1. In other words, the path calculation logic 122c may calculate a geometric length between "3Vref+Vref*C1_dfe" and the first receiving signal SIG_rx1 to obtain a path from the second state ST2 of the termination symbol TS to the first state ST1 of the first symbol SB1.

The path calculation logic 122c may calculate a geometric length between "Vref+Vref*C1_dfe" and the first receiving signal SIG_rx1 to obtain a path from the second state ST2 of the termination symbol TS to the second state ST2 of the first symbol SB1. Similarly, the path calculation logic 122c may calculate a geometric length between each of "−Vref+Vref*C1_dfe" and "−3Vref+Vref*C1_dfe" and the first receiving signal SIG_rx1 to obtain a path from the second state ST2 of the termination symbol TS to each of the third and fourth states ST3 and ST4 of the first symbol SB1.

Based on the afore-described method, the path calculation logic 122c may calculate paths between the plurality of symbols, e.g., the first to eighth symbols SB1 to SB8. As an example, as shown in Table 1, there are 16 paths between a preceding symbol (e.g., the first symbol SB1) and a current symbol (e.g., the second symbol SB2), and the reference, which is used for each path calculation, are given in Table 1, however the example embodiments are not limited thereto.

Although a method of operating the path calculation logic 122c is described with reference to FIG. 8, the example embodiments of the inventive concepts are not limited to this example. For example, the path calculation logic 122c may be configured to calculate all possible paths between symbols, etc.

Additionally, the path calculation logic 122c may be configured to perform a path calculation on a current symbol, to determine a survival path from the calculated paths, and to perform a path calculation for only a state corresponding to the preceding survival path, in a path calculation on a following symbol. Among accumulated paths for respective states of the current symbol, a path whose accumulated path length is shortest may be selected as the survival path. The path calculation logic 122c may be configured to determine a survival path after a path calculation on one symbol, instead of calculating all paths, and to omit a path calculation on a following symbol and a path calculation on states which are not associated with the survival path. In this case, it may be possible to reduce the burden of calculation in the path calculation logic 122c.

As described above, the path calculation logic 122c may be configured to perform a path calculation, based on the reference set REF_SET and termination symbol TS which are determined on the basis of the preceding DFE data DT_dfe'. In other words, even under a communication environment in which the termination symbol TS is not explicitly provided, the termination symbol TS may be determined based on the preceding DFE data DT_dfe'. Also, since the reference set REF_SET is generated based on the reference voltage Vref of the receiving equalizer 121, information on the response characteristics of the channel CH may be reflected into the generated reference set REF_SET. In other words, according to some example embodiments of the inventive concepts, it may be possible to improve the reliability of the first receiving circuit 120 to reduce the burden of calculation, and to reduce complexity in structure of the circuit.

Figure 9:
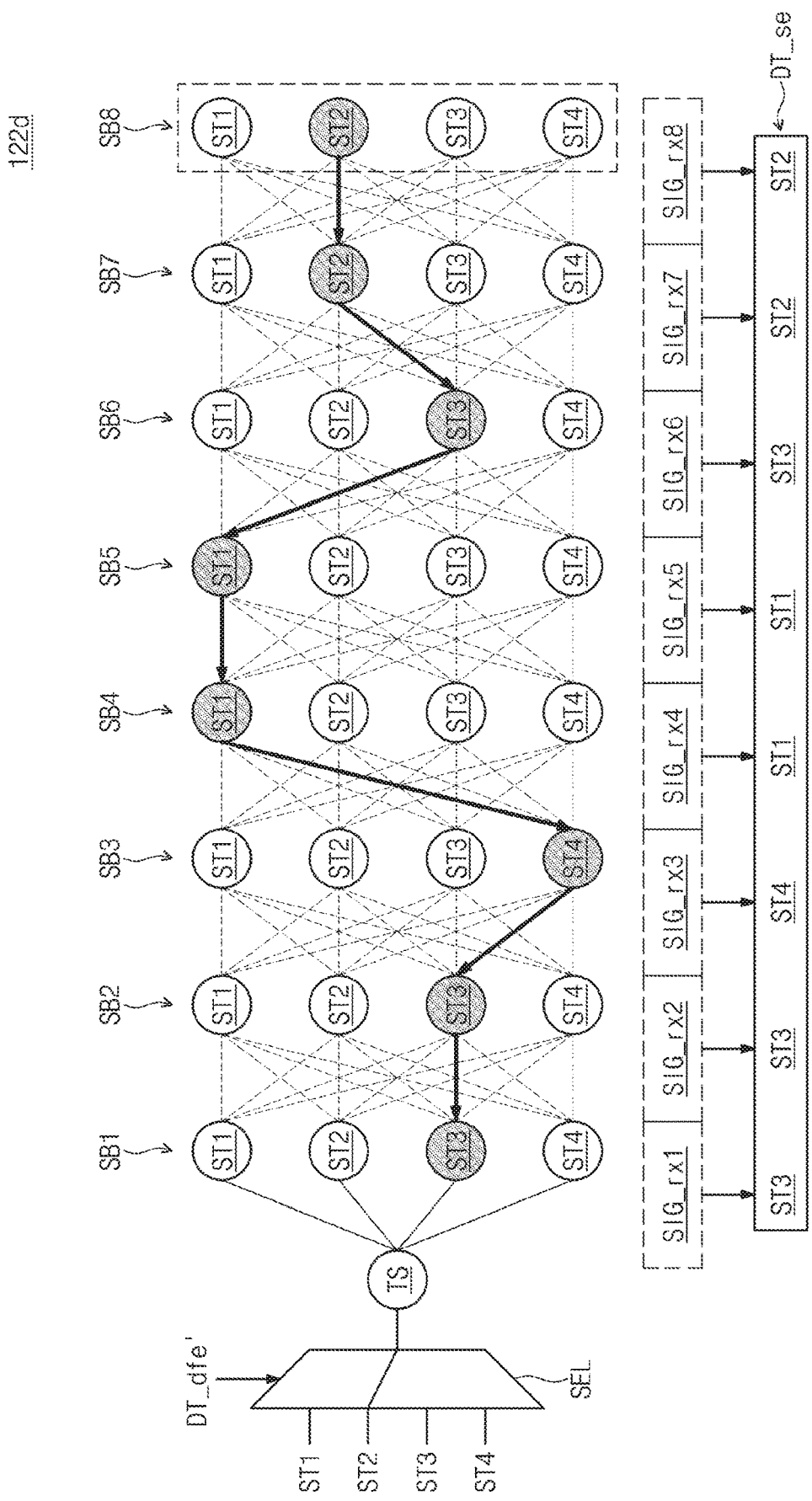
FIG. 9 is a diagram illustrating an operation of a decision logic of FIG. 5 according to at least one example embodiment.

FIG. 9 is a diagram illustrating an operation of a decision logic of FIG. 5 according to at least one example embodiment. For the sake of brevity, a previously described element may be identified by the same reference number without repeating an overlapping description thereof.

Referring to FIGS. 5 and 9, the decision logic 122d may determine a state of each of the plurality of symbols, e.g., the first to eighth symbols SB1 to SB8, based on the path calculation result of the path calculation logic 122c and then output the determined states as the sequence data DT_se. The path calculation result of the path calculation logic 122c may be stored in, for example, an additional storage circuit (not shown). The decision logic 122d may compare accumulated paths for each of the plurality of states associated with the last symbol, e.g., the first to fourth states ST1-ST4 of the last symbol, and then may determine a state having the shortest accumulated path as a state of the last symbol, the eighth symbol SB8. The decision logic 122d may determine a state for each of the first to seventh symbols SB1 to SB7 based on the determined result and the path calculation result.

For example, the decision logic 122d may compare accumulated path values, which are respectively obtained for the plurality of states, e.g., the first to fourth states ST1 to ST4, of the eighth symbol SB8. Here, the accumulated path value may represent an accumulated path from the termination symbol TS to each of the first to fourth states ST1-ST4 of the eighth symbol SB8. As a detailed example, the accumulated path for the first state ST1 of the eighth symbol SB8 may represent a sum of respective paths, each of which starts from the termination symbol TS and arrives at the first state ST1 of the eighth symbol SB8, and the accumulated path for the second state ST2 of the eighth symbol SB8 may represent a sum of respective paths, each of which starts from the termination symbol TS and arrive at the second state ST2 of the eighth symbol SB8.

As shown in FIG. 9, it may be determined that the accumulated path for the second state ST2 of the eighth symbol SB8 is the shortest path. For example, the accumulated paths from the termination symbol TS to the first to fourth states ST1 to ST4 of the eighth symbol SB8 may have first to fourth values, respectively, and the second value may be the smallest of the first to fourth values. As a value of a specific accumulated path is greater, a probability that the state of each of the symbols will be determined along the specific accumulated path may be smaller. That is, in the case where the accumulated path for the second state ST2 is shorter than the accumulated path for each of other states ST1, ST3, and ST4, the probability that the eighth symbol SB8 will be the second state ST2 may be highest.

In other words, in the case where, for the eighth symbol SB8, the accumulated path of the second state ST2 is determined to be the shortest accumulated path, the state of the eighth symbol SB8 corresponding to the eighth receiving signal SIG_rx8 may be determined to be the second state ST2. Thereafter, the path calculation logic 122c may perform a back-tracking process on the path from the seventh symbol SB7 to the first symbol SB1 to determine a state for each symbol. The back-tracking process may be performed to compare accumulated paths for respective states in each symbol, as described above.

As a result, the states for the receiving signals, e.g., the first to eighth receiving signals SIG_rx1 to SIG_rx8, may be determined as "ST3", "ST3", "ST4", "ST1", "ST1", "ST3", "ST2", and "ST2", respectively as shown in FIG. 9, but are not limited thereto. The decision logic 122d may output the final sequence data DT_se, based on the determined states. For example, in the case where the first, second, third, and fourth states ST1, ST2, ST3, and ST4 correspond to "10", "11", "01", and "00", respectively, the final sequence data DT_se of FIG. 8 may have a value of "0101001010011111".

As an example, the operations of the path calculation logic 122c and the decision logic 122d described with reference to FIGS. 8 and 9 may be Viterbi-algorithm-based operations. However, the example embodiments of the inventive concepts are not limited to this example, and the sequence estimator 122 may be operated based on various estimation algorithms.

Figure 10:
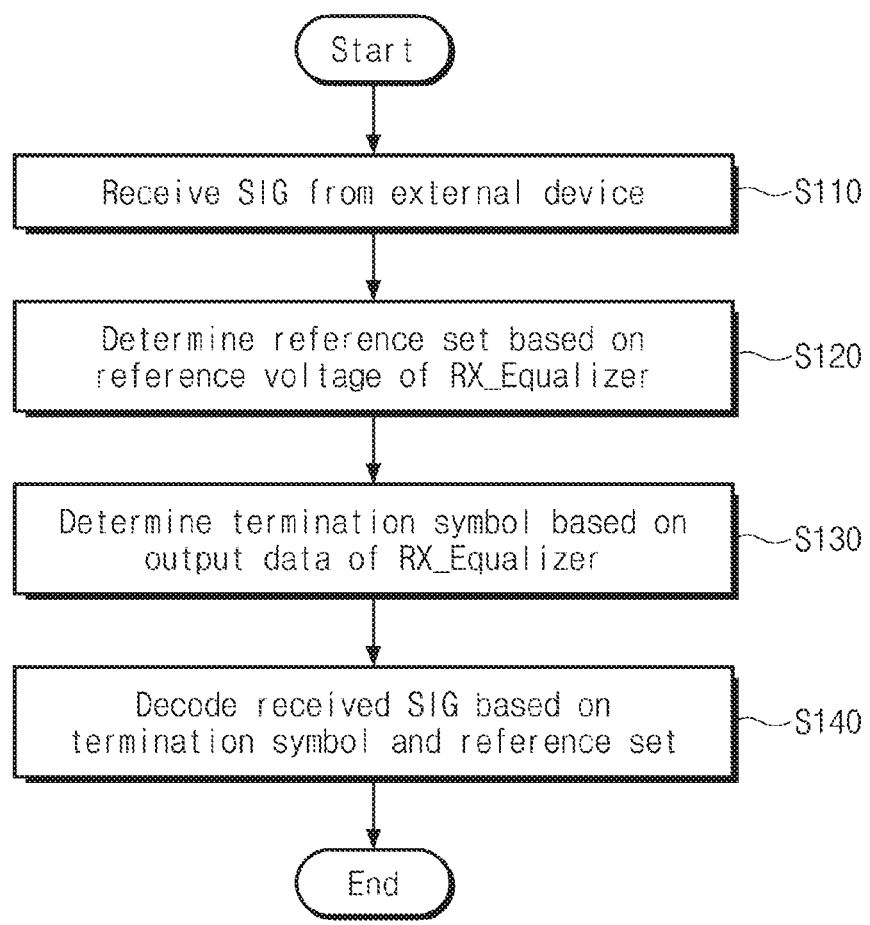
FIG. 10 is a flow chart illustrating an operation of a first receiving circuit of FIG. 2 according to at least one example embodiment.

FIG. 10 is a flow chart illustrating an operation of the first receiving circuit 120 of FIG. 2 according to at least one example embodiment. Referring to FIGS. 2 and 10, in operation S110, the first receiving circuit 120 may receive a signal SIG from an external device. For example, the first receiving circuit 120 may receive the signal SIG containing a specific information (e.g., data) from the first transmitting circuit 110 through the channel CH. In at least one example embodiment, the received signal SIG may be distorted by the response characteristics of the channel CH and/or by noise (e.g., signal noise).

In operation S120, the first receiving circuit 120 may generate the reference set REF_SET, based on the reference voltage Vref of the receiving equalizer 121. For example, the sequence estimator 122 of the first receiving circuit 120 may generate the reference set REF_SET including a plurality of reference levels based on the reference voltage Vref of the receiving equalizer 121, according to an operating method described with reference to FIG. 6. As an example, the plurality of reference levels included in the reference set REF_SET may vary depending on the number of states constituting one symbol, the number of coefficients reflected in the reference levels, and/or the number of taps, etc.

In operation S130, the first receiving circuit 120 may determine the termination symbol TS based on the equalization data (i.e., the DFE data DT_dfe) of the receiving equalizer 121. For example, the sequence estimator 122 of the first receiving circuit 120 may determine the termination symbol TS based on the DFE data DT_dfe, according to an operating method described with reference to FIG. 7.

In operation S140, the first receiving circuit 120 may decode the received signal SIG, based on the termination symbol TS and the reference set REF_SET. For example, the sequence estimator 122 of the first receiving circuit 120 may determine states of symbols corresponding to the received signal SIG and may output the final sequence data DT_se based on the determined states, according to an operating method described with reference to FIGS. 8 and 9.

Figure 11A:
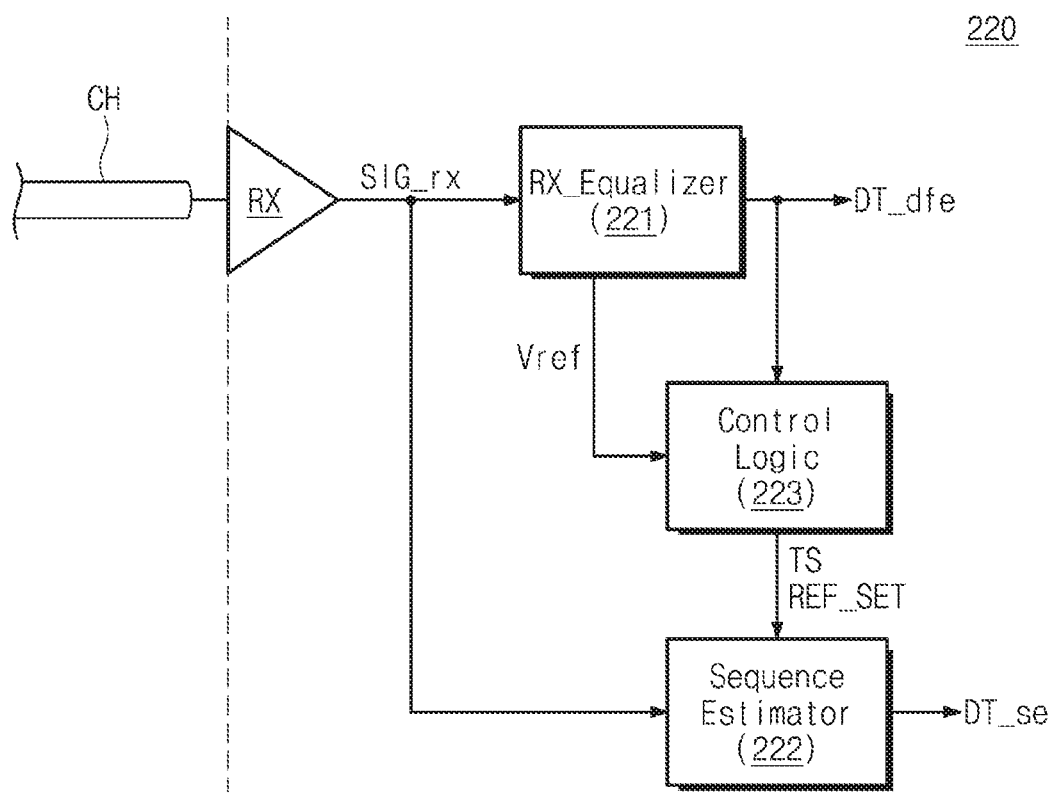
FIGS. 11A and 11B are block diagrams illustrating various structures of a first receiving circuit according to some example embodiments of the inventive concepts.
Figure 11B:
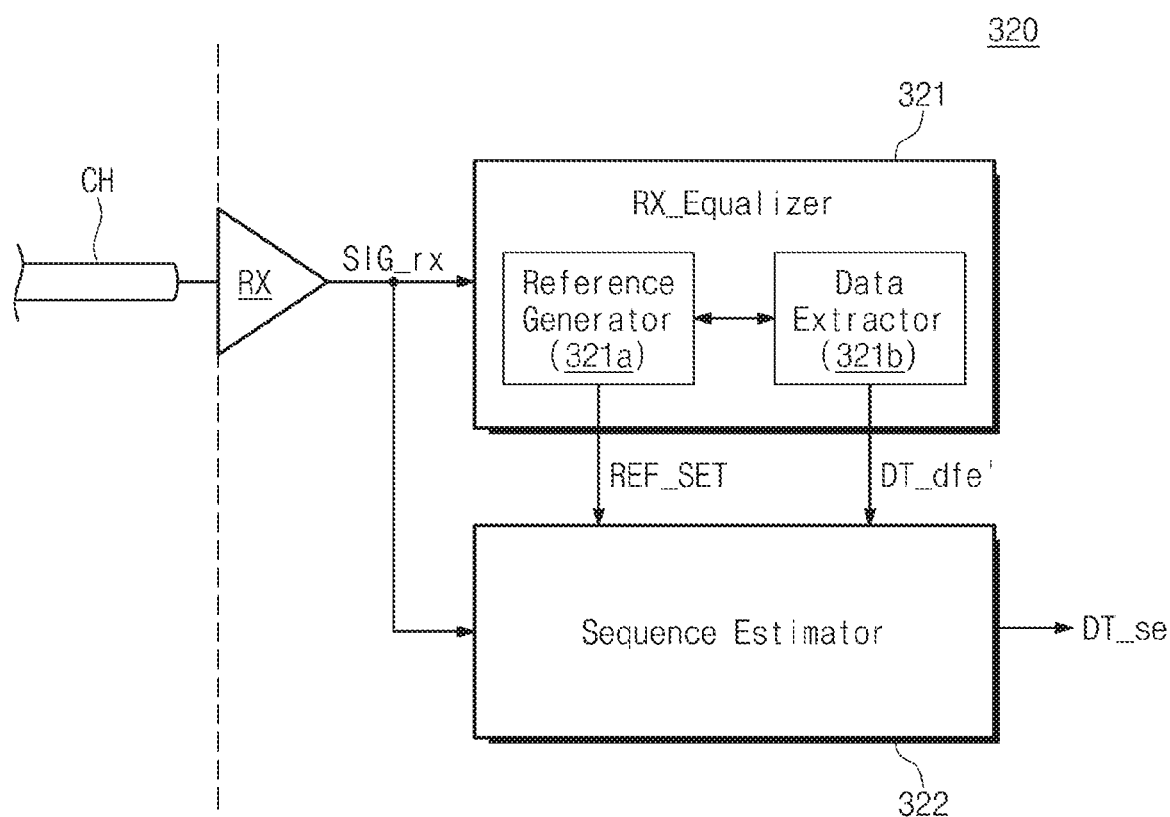

FIGS. 11A and 11B are block diagrams illustrating various structures of a first receiving circuit according to some example embodiments of the inventive concepts. For concise description, a previously described element may be identified by the same reference number without repeating an overlapping description thereof.

Referring to FIG. 11A, a first receiving circuit 220 may include the receiving driver RX, a receiving equalizer 221, a sequence estimator 222, and/or a control logic 223, but is not limited thereto. The receiving driver RX and the receiving equalizer 221 according to at least one example embodiment were described above, and thus, a detailed description thereof will be omitted.

When compared with the first receiving circuit 120 of FIG. 2, the first receiving circuit 220 of FIG. 11A may further include the control logic 223. The control logic 223 may be provided in the form of additional hardware or a combination of hardware and software that is independent of the sequence estimator 222, such as special purpose SoC, FPGA, processor, and/or other processing device, specially programmed to perform the operations of at least one example embodiment. The control logic 223 may be configured to perform the functions of the reference generator 122a and the termination symbol determination logic 122b of FIG. 5. In other words, unlike the sequence estimator 122 described with reference to FIGS. 2 to 9, the sequence estimator 222 of FIG. 11A may be configured to serve as a simple Viterbi decoder, and a variety of information (e.g., the termination symbol TS and the reference set REF_SET) required for the operation of the sequence estimator 222 may be provided from the control logic 223.

Similar to those in one or more of the afore-described example embodiments, the control logic 223 may produce the termination symbol TS and the reference set REF_SET, based on the DFE data DT_dfe (in detail, the preceding DFE data DT_dfe') and the reference voltage Vref of the receiving equalizer 221, and then may provide them to the sequence estimator 222.

Next, referring to FIG. 11B, a first receiving circuit 320 may include the receiving driver RX, a receiving equalizer 321, and/or a sequence estimator 322, but is not limited thereto. The receiving driver RX may be configured to have the same features as that described with reference to FIG. 2, and thus, a detailed description thereof will be omitted.

The receiving equalizer 321 of FIG. 11B may be configured to include a reference generator 321a and a data extractor 321b, unlike the receiving equalizers 121 and 221 of previously described example embodiments. The reference generator 321a may generate the reference set REF_SET based on the method described with reference to FIG. 6. In at least one example embodiment, the receiving equalizer 321 may output the DFE data DT_dfe, based on the method described with reference to FIGS. 4A and 4B. Here, the receiving equalizer 321 may be configured to reflect (e.g., insert, etc.) a coefficient into a signal by each delay unit DL and/or to perform various operations for determining data of a signal input to the slicer SL.

Some of the afore-described various operations of the receiving equalizer 321 may be overlapped with an operation of generating the reference set REF_SET of the reference generator 321a. In other words, the reference generator 321a may be realized as a part of a logic circuit for performing various operations of the receiving equalizer 321. In this case, the reference set REF_SET may be generated from the receiving equalizer 321, without any additional circuitry.

The data extractor 321b may be configured to output the DFE data DT_dfe (in more detail, the preceding DFE data DT_dfe') with a desired and/or predetermined interval. Here, the desired and/or predetermined interval may correspond to a length of the sequence data DT_se.

The sequence estimator 322 may execute a decoding operation on the receiving signal SIG_rx, based on the reference set REF_SET and the preceding DFE data DT_dfe'. The operation of the sequence estimator 322 was described above, and thus, a detailed description thereof will be omitted.

Figure 12:
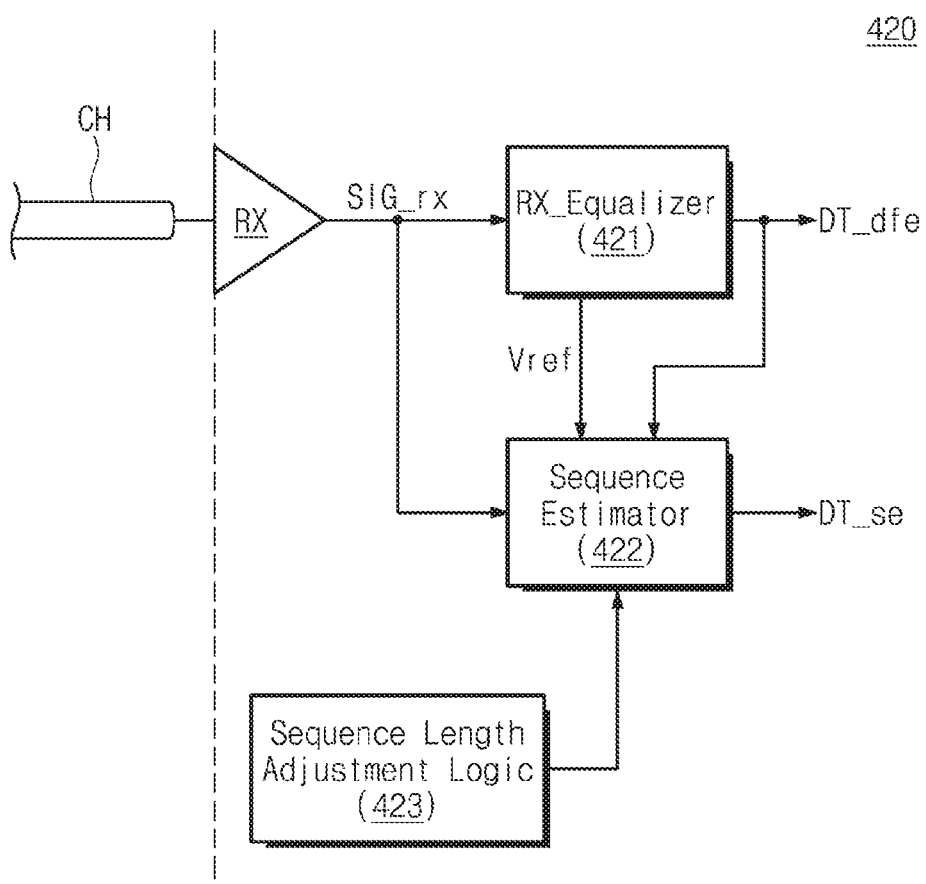
FIG. 12 is a block diagram illustrating a first receiving circuit according to at least one example embodiment of the inventive concepts.

FIG. 12 is a block diagram illustrating a first receiving circuit according to at least one example embodiment of the inventive concepts. For concise description, a previously described element may be identified by the same reference number without repeating an overlapping description thereof.

Referring to FIG. 12, a first receiving circuit 420 may include the receiving driver RX, a receiving equalizer 421, a sequence estimator 422, and/or a sequence length adjustment logic 423, etc., but is not limited thereto. The receiving driver RX, the receiving equalizer 421, and the sequence estimator 422 may be configured to have substantially the same features as those described above, and thus, a detailed description thereof will be omitted.

The sequence length adjustment logic 423 may be configured to adjust a length of the sequence data DT_se. For example, the length of the sequence data DT_se may represent the number of symbols or bits that are included in one sequence data DT_se.

In at least one example embodiment, the sequence estimator 422 may be configured to determine the termination symbol TS, without the use of a desired and/or predetermined termination symbol, based on the DFE data DT_dfe from the receiving equalizer 421. In other words, even when the length of the sequence data DT_se is changed in accordance with a design method of a device in which the first receiving circuit 420 is included, the sequence estimator 422 may be used to determine the termination symbol TS. In other words, even when the length of the sequence data DT_se is changed, the sequence estimator 422 may output the sequence data DT_se normally.

Figure 13:
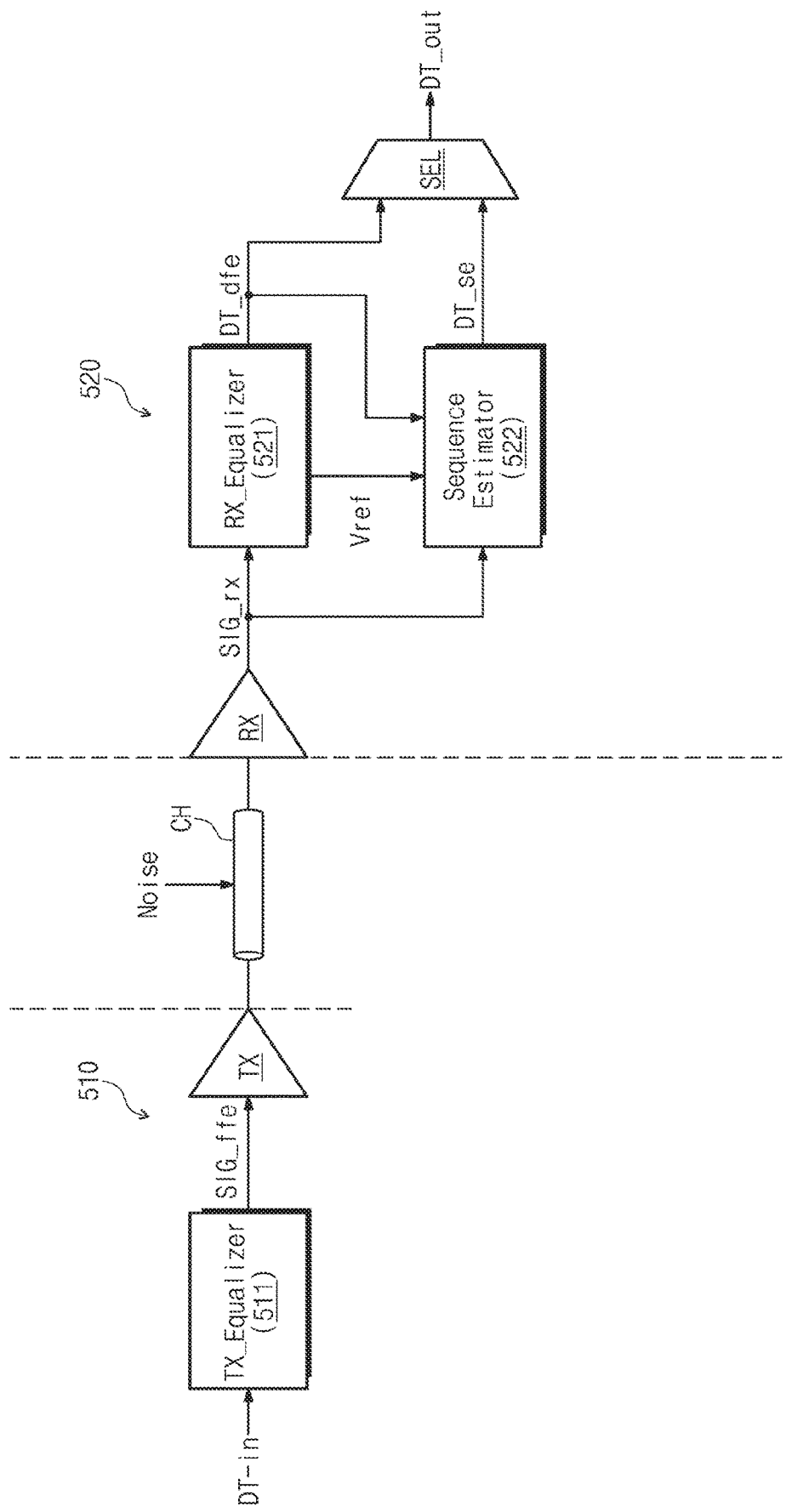
FIG. 13 is a block diagram illustrating a first transmitting device and a first receiving device, according to some example embodiments of the inventive concepts.

FIG. 13 is a block diagram illustrating a first transmitting device and a first receiving device according to at least one example embodiment of the inventive concepts. Referring to FIG. 13, a first transmitting device 510 may be configured to provide a signal, in which specific information is contained, to a first receiving device 520 through the channel CH.

The first transmitting device 510 may include a transmitting equalizer 511 and/or the transmitting driver TX, but is not limited thereto. The operations of the transmitting equalizer 511 and the transmitting driver TX were described above, and thus, a detailed description thereof will be omitted.

The first receiving device 520 may include the receiving driver RX, a receiving equalizer 521, a sequence estimator 522, and/or the selector SEL, but is not limited thereto. The receiving driver RX, the receiving equalizer 521, and the sequence estimator 522 may be configured to have substantially the same features as those described above, and thus, a detailed description thereof will be omitted.

The selector SEL may be configured to select one of the equalization data (i.e., the DFE data DT_dfe) from the receiving equalizer 521 and the equalization data (i.e., the sequence data DT_se) from the sequence estimator 522. For example, in the case where the noise entering the channel CH is weakened, diminished, intermittent, and/or vanishes under certain communication environments, it may be possible to realize sufficiently high reliability of the DFE data DT_dfe that is output from the receiving equalizer 521.

By contrast, in the case where the noise entering the channel CH is large under certain communication environments, it may be difficult to obtain sufficiently high reliability of the DFE data DT_dfe that is output from the receiving equalizer 521, but it may be possible to secure sufficiently high reliability for the sequence data DT_se output from the sequence estimator 522. This is because the operation of the sequence estimator 522 has higher recovery property than that in the operation of the receiving equalizer 521. However, the operation of the sequence estimator 522 may require additional power.

According to a communication environment or an additional requirement, the selector SEL may be configured to select one of the DFE data DT_dfe and the sequence data DT_se, which are output from the receiving equalizer 521 and the sequence estimator 522, respectively, and then to output the selected data. In at least one example embodiment, in the case where it is possible to realize the sufficiently high reliability for the DFE data DT_dfe output from the receiving equalizer 521, the DFE data DT_dfe may be selected and the sequence estimator 522 may be inactivated.

In at least one example embodiment, in a training process of the first transmitting device 510 and the first receiving device 520, information for controlling the selector SEL may be determined. For example, the first transmitting device 510 and the first receiving device 520 may execute a training operation. The training operation may refer to an operation of adjusting coefficients and/or control values for the transmitting and receiving equalizers 511 and 521 depending on (and/or based on) the status of the channel CH between the first transmitting device 510 and the first receiving device 520. The status of the channel CH (e.g., a magnitude of a noise and so forth) may be evaluated through the training operation.

In the case where a magnitude of a noise in the channel CH is larger than a threshold value (i.e., if a noise larger than a threshold noise is included in data to be transmitted or received through the channel CH), the selector SEL may be configured such that the sequence data DT_se output from the sequence estimator 522 is selected. In other words, the selector SEL selects the sequence data DT_se based on the magnitude of the noise in the channel CH and a desired noise threshold value. By contrast, in the case where a magnitude of a noise of the channel CH is smaller than a threshold value (i.e., if a noise smaller than a threshold noise is included in data to be transmitted or received through the channel CH), the selector SEL may be configured such that the equalization data DT_dfe output from the receiving equalizer 521 is selected. In at least one example embodiment, in the case where the selector SEL is configured to select the equalization data DT_dfe output from the receiving equalizer 521, the sequence estimator 522 may not perform an additional operation.

Figure 14:
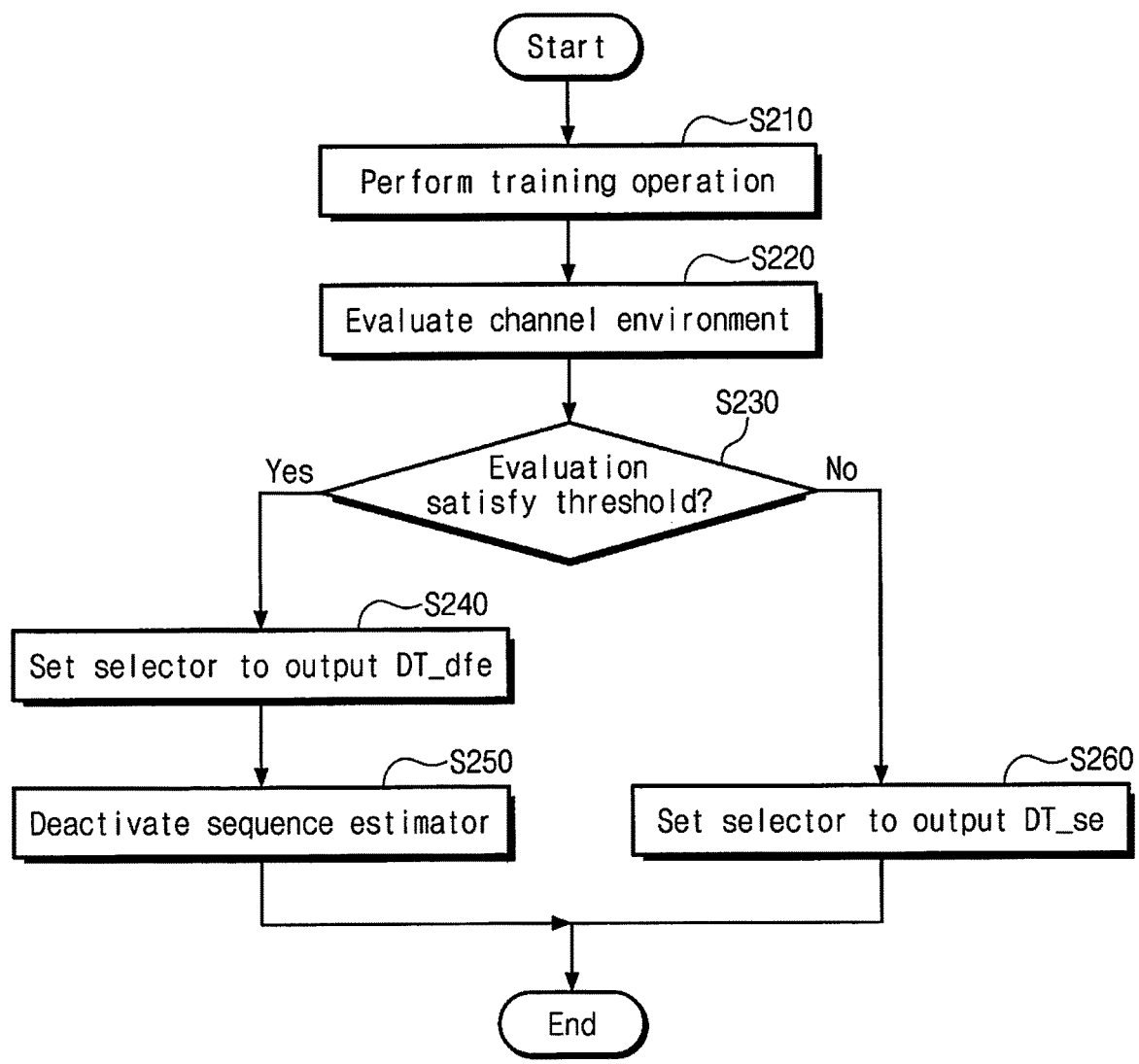
FIG. 14 is a flow chart illustrating an operation of a first receiving device of FIG. 13 according to at least one example embodiment.

FIG. 14 is a flow chart illustrating an operation of a first receiving device of FIG. 13 according to at least one example embodiment. Referring to FIGS. 13 and 14, in operation S210, the first receiving device 520 may perform the training operation. For example, the first receiving device 520 may transmit and receive desired and/or predetermined data bits to and from the first transmitting device 510 to perform the training operation. The first receiving device 520 may determine various coefficients, which will be used in the receiving equalizer 521, through the training operation.

In operation S220, the first receiving device 520 may evaluate the channel environment. For example, the first receiving device 520 may evaluate a noise that is produced in the channel and/or to be produced in the channel, response characteristics of the channel, and so forth, through the training operation.

In operation S230, the first receiving device 520 may examine whether the evaluation result satisfies a threshold condition (e.g., a desired threshold condition). For example, based on the evaluation of the channel environment, the first receiving device 520 may determine whether a signal distortion, which is caused by a noise to be produced in the channel and/or the response characteristics of the channel, can be compensated for (and/or corrected) by the receiving equalizer 521. If a variety of signal distortions can be compensated by the receiving equalizer 521, the first receiving device 520 may determine that the evaluation result satisfies the threshold condition, and if not, the first receiving device 520 may determine that the evaluation result does not satisfy the threshold condition. In at least one example embodiment, the threshold condition may be determined, based on various factors of the communication environment, performance (or the tap number), of the receiving equalizer, performance (or the tap number) of the transmitting equalizer, or the like.

If the evaluation result satisfies the threshold condition, the first receiving device 520 may allow the selector SEL to select the equalization data DT_dfe that is output from the receiving equalizer 521, in operation S240. That is, in the case where a signal distortion, which is caused from the channel CH, can be compensated by the receiving equalizer 521, the selector SEL may be set to output the equalization data DT_dfe that is output from the receiving equalizer 521.

In at least one example embodiment, if the evaluation result satisfies the threshold condition, the first receiving device 520 may inactivate (e.g., deactivate) the sequence estimator 522, in operation S250. That is, in the case where the evaluation result satisfies the threshold condition, a signal distortion can be compensated by the receiving equalizer 521, and thus, the operation of the sequence estimator 522 may not be desired and/or required. In this case, in order to decrease and/or prevent additional power consumption, the sequence estimator 522 may be deactivated.

If the evaluation result does not satisfy the threshold condition, the first receiving device 520 may allow the selector SEL to select the sequence data DT_se, in operation S260. For example, in the case where a signal distortion, which is produced from the channel CH, cannot be compensated (e.g., cannot be corrected, etc.) by only the receiving equalizer 521, the selector SEL may be set to select the sequence data DT_se output from the sequence estimator 522.

Various structures of the first transmitting device and the first receiving device according to some example embodiments of the inventive concepts have been described with reference to FIGS. 11A to 14, but the example embodiments of the inventive concepts are not limited to this example. For example, various elements of the first receiving device may be realized in one hardware module, or a combination of hardware and software module, or in separated modules.

Figure 15:
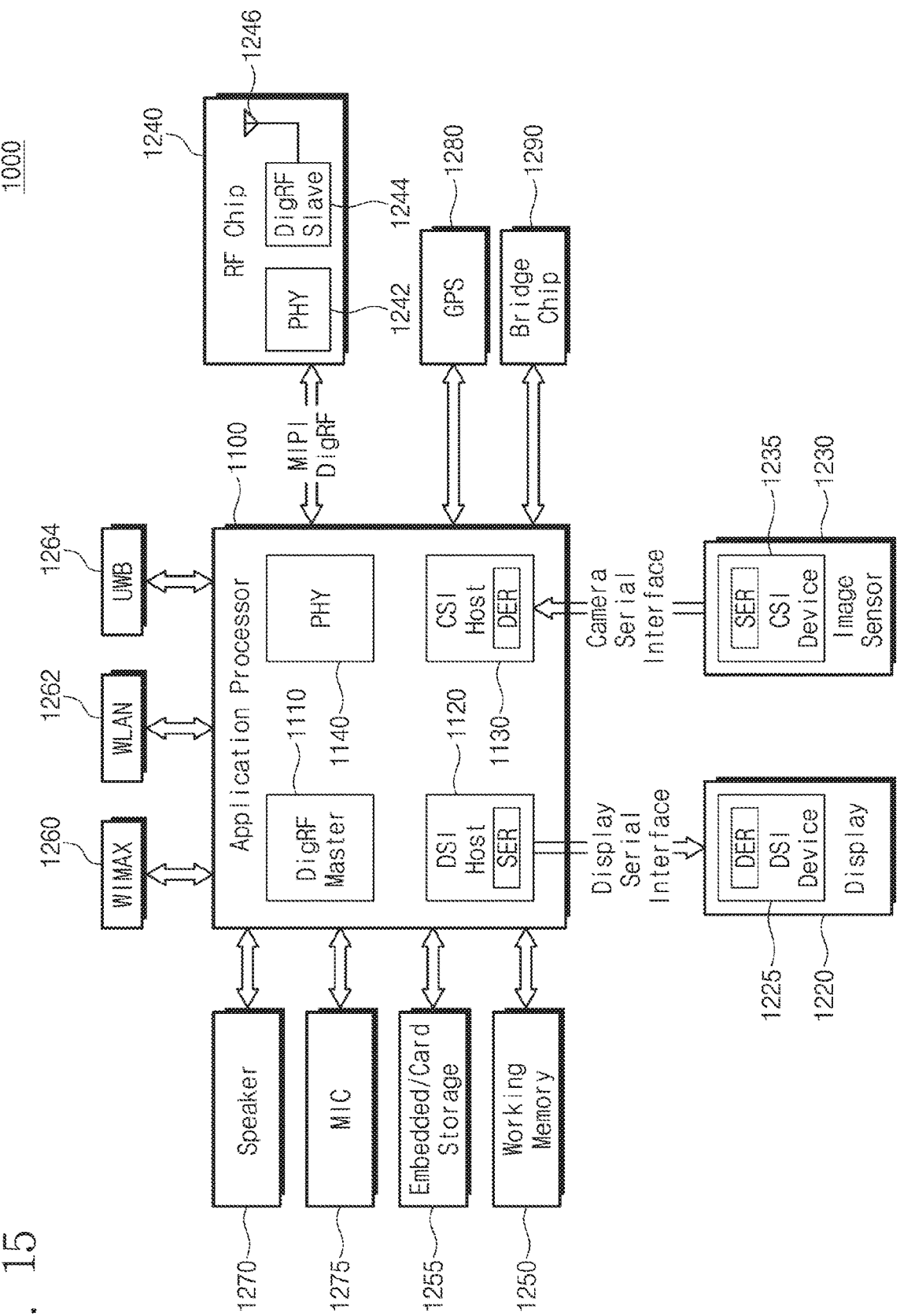
FIG. 15 is a block diagram illustrating an electronic system, in which a receiving device according to at least one example embodiment of the inventive concepts is provided.

FIG. 15 is a block diagram illustrating an electronic system, in which a receiving device according to at least one example embodiment of the inventive concepts is provided. Referring to FIG. 15, an electronic system 1000 may be provided in the form of a portable communication terminal, a personal digital assistant (PDA), a portable multimedia player (PMP), a smartphone, or a wearable device or in the form of a computing system such as a personal computer, a server, a workstation, or a notebook computer.

The electronic system 1000 may include an application processor or a central processing unit 1100, a display 1220, and/or an image sensor 1230, but is not limited thereto. The application processor 1100 may include a DigRF master 1110, a display serial interface (DSI) host 1120, a camera serial interface (CSI) host 1130, and a physical layer 1140.

The DSI host 1120 may communicate with a DSI device 1225 of the display 1220 through the DSI. In at least one example embodiment, an optical serializer SER may be provided in the DSI host 1120. For example, an optical deserializer DES may be provided in the DSI device 1225. The CSI host 1130 may communicate with a CSI device 1235 of the image sensor 1230 through a camera serial interface. In at least one example embodiment, the optical deserializer DES may be provided in the CSI host 1130. The optical serializer SER may be provided in the CSI device 1235.

The electronic system 1000 may further include a radio frequency (RF) chip 1240, which is used to communicate with the application processor 1100. The RF chip 1240 may include a physical layer 1242, a DigRF slave 1244, and an antenna 1246. In at least one example embodiment, the physical layer 1242 of the RF chip 1240 and the physical layer 1140 of the application processor 1100 may be configured to exchange data with each other through a MIPI DigRF interface.

The electronic system 1000 may further include a working memory 1250 (e.g., a memory device, etc.) and an embedded/card storage 1255. The working memory 1250 and the embedded/card storage 1255 may be used to store data provided from the application processor 1100. The working memory 1250 and the embedded/card storage 1255 may also be used to provide the stored data to the application processor 1100.

The working memory 1250 may temporarily store data, which was processed or will be processed by the application processor 1100. The working memory 1250 may include a volatile memory, such as a static random access memory (SRAM), a dynamic RAM (DRAM), and/or a synchronous DRAM (SDRAM), etc., and/or a nonvolatile memory, such as a FLASH memory, a phase change RAM (PRAM), a magnetic RAM (MRAM), a resistive RAM (ReRAM), and/or a ferroelectric RAM (FRAM), etc. The embedded/card storage 1255 may store data regardless of a power supply.

The electronic system 1000 may communicate with an external system through a communication manner such as a worldwide interoperability for microwave access (WiMAX) 1260, a wireless local area network (WLAN) 1262, and an ultra-wideband (UWB) 1264, or the like.

The electronic system 1000 may further include a speaker 1270 and a microphone 1275 for processing voice information. The electronic system 1000 may further include a global positioning system (GPS) device 1280 for processing position information. The electronic system 1000 may further include a bridge chip 1290 for managing connections between or to peripheral devices.

In at least one example embodiment, each of the elements shown in FIG. 15 may include the transmitting circuit and/or the receiving circuit described with reference to FIGS. 1 to 14 and may be operated based on the operation method described above. In some example embodiments, the electronic system 1000 of FIG. 15 may be operated, in conjunction with other external electronic device, based on the operation method described above.

According to some example embodiments of the inventive concepts, a termination symbol required for a maximum likelihood sequence estimator (MLSE) may be determined based on an output (e.g., equalization data) of a receiving equalizer, and reference levels required for the MLSE may be determined based on a reference voltage of the receiving equalizer. Thus, sequence may be normally estimated even under a communication environment, in which such termination symbol and reference levels are not defined, and this may make it possible to improve reliability of the signal receiving circuit.

While various example embodiments of the inventive concepts have been particularly shown and described, it will be understood by one of ordinary skill in the art that variations in form and detail may be made therein without departing from the spirit and scope of the attached claims.

What is claimed is:

1. A signal receiving circuit, comprising:
 a receiving equalizer configured to,
  receive a receiving signal from an external device,
  generate a compensated received signal by compensating for inter-symbol interference (ISI) included in the received signal, and
  output equalization data, the equalization data based on the compensated received signal; and
 a maximum likelihood sequence estimator (MLSE) configured to,
  determine a termination symbol based on the equalization data,
  perform Viterbi decoding on the received signal based on the determined termination symbol, and
  output sequence data, the sequence data based on the Viterbi decoded received signal.

2. The signal receiving circuit of claim 1, wherein the MLSE is further configured to:
 generate a reference set of voltages based on a reference voltage of the receiving equalizer;
 calculate paths between a plurality of symbols included in the received signal based on the termination symbol and the reference set of voltages; and
 determine the sequence data based on the calculated paths.

3. The signal receiving circuit of claim 2, wherein the MLSE is further configured to calculate a path from the termination symbol to a first symbol of the plurality of symbols.

4. The signal receiving circuit of claim 2, wherein the MLSE is further configured to:
 extract a value corresponding to a last data of a preceding sequence data from the equalization data, the preceding sequence data having been decoded before the sequence data; and
 determine a state from a plurality of states as the termination symbol, the determined state corresponding to the extracted value.

5. The signal receiving circuit of claim 2, wherein the MLSE is further configured to:
 determine references for each of a plurality of states based on the reference voltage; and
 determine a plurality of reference levels included in the reference set based on the determined references and at least one coefficient of the receiving equalizer.

6. The signal receiving circuit of claim 5, wherein the MLSE is further configured to calculate at least one of the paths between the plurality of symbols based on a corresponding reference level of the plurality of reference levels.

7. The signal receiving circuit of claim 2, wherein the MLSE is further configured to:
 select a state, from a plurality of states of a last symbol of the plurality of symbols and whose accumulated path has a shortest length based on a result of the calculation of the paths; and
 output the sequence data based on the selected state.

8. The signal receiving circuit of claim 2, wherein the receiving is further configured to:
 delay a preceding equalization data by a desired period of time, the preceding equalization data being processed before the equalization data;
 output the delayed preceding equalization data as a delayed signal;
 sum the delayed signal, the summing including reflecting a first coefficient in the delayed signal;
 sample the summed signal based on the reference voltage; and
 output the sampled signal as the equalization data.

9. The signal receiving circuit of claim 1, wherein the receiving equalizer is a decision feedback equalizer (DFE) circuit that includes an N-tap structure, where N is a natural number.

10. The signal receiving circuit of claim 1, further comprising:
 a sequence length adjustment logic configured to adjust a length of the sequence data.

11. A method of operating a signal receiving circuit comprising:
 receiving, using at least one processor, a signal from an external device;
 generating, using the at least one processor, a compensated signal by compensating for inter-symbol interference included in the received signal;

generating, using the at least one processor, equalization data based on the compensated signal;

determining, using the at least one processor, a termination symbol based on the equalization data;

performing, using the at least one processor, a Viterbi decoding on the received signal based on the termination symbol; and output, using the at least one processor, sequence data, the sequence data based on the Viterbi decoded received signal.

12. The method of claim 11, further comprising:

generating, using the at least one processor, a reference set based on a reference voltage, the reference set including a plurality of reference levels.

13. The method of claim 12, wherein the generating the reference set further includes:

generating each of the plurality of reference levels based on the reference voltage and at least one coefficient.

14. The method of claim 12, wherein the performing the Viterbi decoding further includes:

calculating paths between a plurality of symbols based on the termination symbol and the reference set, the plurality of symbols included in the received signal;

determining a shortest path among the calculated paths; and outputting the sequence data based on the determined shortest path.

15. The method of claim 14, wherein the generating the compensated signal further includes:

generating a delayed signal by delaying the equalization data by a desired time;

generating a summed signal based on a reflected signal including a coefficient in the delayed signal and the received signal; and sampling, based on the reference voltage, the summed signal to output the equalization data.

16. A signal receiving circuit, comprising:

a receiving equalizer configured to,
  receive a signal from an external transmitting device through a communication channel,
  compensate for an inter-symbol interference (ISI) included in the received signal, and
  output equalization data, the equalization data based on the compensated received signal;

a maximum likelihood sequence estimator (MLSE) configured to,
  determine a termination symbol based on the equalization data,
  perform Viterbi decoding on the received signal based on the determined termination symbol, and
  output sequence data, the sequence data based on the Viterbi decoded received signal; and a selector configured to select and output one of the equalization data and the sequence data based on a state of the communication channel.

17. The signal receiving circuit of claim 16, wherein the state of the communication channel is evaluated through a training operation, which is performed in conjunction with the external transmitting device.

18. The signal receiving circuit of claim 17, wherein the selector is configured to select and output the sequence data in response to a result of the training operation evaluation not satisfying a threshold condition; and the selector is configured to select and output the equalization data in response to the result of the training operation evaluation satisfying the threshold condition.

19. The signal receiving circuit of claim 18, wherein the threshold condition is selected based on performance of the receiving equalizer or a tap number of the receiving equalizer.

20. The signal receiving circuit of claim 16, wherein the MLSE is further configured to:

determine the termination symbol based on the equalization data;

calculate paths between a plurality of symbols based on the termination symbol and a reference set, the plurality of symbols included in the received signal; and determine and output the sequence data based on the calculated paths.

* * * * *